US011687690B2

(12) United States Patent
Chen et al.

(10) Patent No.: US 11,687,690 B2
(45) Date of Patent: Jun. 27, 2023

(54) MITIGATION OF CUTTING-INDUCED STICK-SLIP VIBRATION DURING DRILLING WITH DRILL BITS HAVING DEPTH OF CUT CONTROLLERS

(71) Applicant: Halliburton Energy Services, Inc., Houston, TX (US)

(72) Inventors: Shilin Chen, Montgomery, TX (US); Christopher Charles Propes, Montgomery, TX (US); Curtis Clifford Lanning, Montgomery, TX (US); Bradley David Dunbar, The Woodlands, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 160 days.

(21) Appl. No.: 17/074,352

(22) Filed: Oct. 19, 2020

(65) Prior Publication Data

US 2022/0121791 A1    Apr. 21, 2022

(51) Int. Cl.
   *G06F 30/20* (2020.01)
   *E21B 10/43* (2006.01)
   *E21B 47/00* (2012.01)
   *E21B 10/567* (2006.01)

(52) U.S. Cl.
   CPC .............. *G06F 30/20* (2020.01); *E21B 10/43* (2013.01); *E21B 47/00* (2013.01); *E21B 10/567* (2013.01)

(58) Field of Classification Search
   CPC .......... G06F 30/20; E21B 10/43; E21B 47/00; E21B 10/567
   See application file for complete search history.

(56) References Cited

U.S. PATENT DOCUMENTS

| 8,863,860 B2 | 10/2014 | Chen et al. |
| 2001/0020551 A1 | 9/2001 | Taylor et al. |
| 2010/0032165 A1 | 2/2010 | Bailey et al. |
| 2010/0224413 A1 | 9/2010 | Warren |

(Continued)

FOREIGN PATENT DOCUMENTS

WO    2014121448 A1    8/2014

OTHER PUBLICATIONS

Jaggi A, Upadhaya S, Chowdhury AR. Successful PDC/RSS Vibration Management Using Innovative Depth-of-Cut Control Technology: Panna Field, Offshore India. InSPE/IADC Drilling Conference Feb. 20, 2007. OnePetro. (Year: 2007).*

(Continued)

*Primary Examiner* — Chuen-Meei Gan
(74) *Attorney, Agent, or Firm* — Delizio, Peacock, Lewin & Guerra

(57) ABSTRACT

A method for developing design rules for mitigating cutting-induced stick-slip vibration includes determining at least one value for one or more drill bit performance parameters for a design of a drill bit. The one or more drill bit performance parameters include a functional characteristic of a depth of cut controller of the drill bit. The method includes correlating one or more instances of cutting-induced stick-slip vibration for at least one prior drilling operation to the at least one value for the one or more drill bit performance parameters. The method includes generating drill bit design rules that mitigate cutting-induced stick-slip vibration based on the correlating.

19 Claims, 16 Drawing Sheets

(56) References Cited

U.S. PATENT DOCUMENTS

| | | | |
|---|---|---|---|
| 2011/0214878 A1 | 9/2011 | Bailey et al. | |
| 2013/0081880 A1 | 4/2013 | Schwefe et al. | |
| 2017/0211357 A1* | 7/2017 | Grosz | E21B 41/0092 |
| 2018/0283161 A1* | 10/2018 | Bailey | E21B 45/00 |
| 2020/0386055 A1 | 12/2020 | Chen | |
| 2021/0047909 A1* | 2/2021 | Bailey | E21B 47/00 |
| 2022/0121790 A1 | 4/2022 | Chen et al. | |

OTHER PUBLICATIONS

Davis JE, Smyth GF, Bolivar N, Pastusek PE. Eliminating stick-slip by managing bit depth of cut and minimizing variable torque in the drillstring. InIADC/SPE Drilling Conference and Exhibition Mar. 6, 2012. OnePetro. (Year: 2012).*

Bailey JR, Payette GS, Wang L. Improved Methods to Understand and Mitigate Stick-Slip Torsional Vibrations. InIADC/SPE Drilling Conference and Exhibition Mar. 6, 2018. OnePetro. (Year: 2018).*

Chen S. Factors affecting PDC bit directional behaviors: Numerical simulation and applications. InProceedings of the International Field Exploration and Development Conference 2017 2019 (pp. 117-135). Springer, Singapore. (Year: 2018).*

Chen S, Grosz G, Anderle S, Arfele R, Xun K. The role of rock-chip removals and cutting-area shapes in polycrystalline-diamond-compact-bit design optimization. SPE Drilling & Completion. Dec. 31, 2015;30(04):334-47. (Year: 2015).*

Chen S, Wisinger J, Dunbar B, Propes C. Identification and mitigation of friction-and cutting-action-induced stick/slip vibrations with PDC bits. SPE Drilling & Completion. Dec. 17, 2020;35(04):576-87. (Year: 2020).*

Jain JR, Ledgerwood LW, Hoffmann OJ, Schwefe T, Fuselier DM. Mitigation of torsional stick-slip vibrations in oil well drilling through PDC bit design: putting theories to the test. InSPE Annual Technical Conference and Exhibition Oct. 30, 2011. OnePetro. (Year: 2011).*

Chen, et al., "Identification and Mitigation of Friction- and Cutting Action-Induced Stick-Slip Vibrations with PDC Bits", Society of Petroleum Engineers, IADC/SPE International Drilling Conference and Exhibition, Mar. 3-5, 2020, Galveston, Texas, USA.

"U.S. Appl. No. 16/433,937, Non-Final Office Action", dated Aug. 5, 2022, 12 pages.

Teale, "The Concept of Specific Energy in Rock Drilling", International Journal of Rock Mechanics and Mining Sciences & Geomechanics Abstracts vol. 2, Issue 1, Mar. 1965, pp. 57-73.

* cited by examiner

MITIGATION OF CUTTING-INDUCED STICK-SLIP VIBRATION DURING DRILLING WITH DRILL BITS HAVING DEPTH OF CUT CONTROLLERS

TECHNICAL FIELD

The disclosure generally relates to earth drilling or mining and earth drilling, e.g. deep drilling, for obtaining oil, gas, water, soluble or meltable materials, or a slurry of minerals from wells.

BACKGROUND

During drilling, drill strings can experience stick-slip vibrations that can cause damage to the bit and bottom hole assembly. Stick-slip vibrations can be classified into two categories, cutting-induced stick-slip and friction-induced stick-slip, based on the presence of coupled axial and torsional vibrations. Cutting-induced stick-slip can be a product of cutting torque on a bit from bit/rock interaction. Friction-induced stick-slip can be a product of frictional torque in the drill string arising from contact between the drill string and the wellbore. Mitigation strategies can vary depending on the type of stick-slip experienced.

BRIEF DESCRIPTION OF THE DRAWINGS

Aspects of the disclosure may be better understood by referencing the accompanying drawings.

DESCRIPTION

The description that follows includes example systems, methods, techniques, and program flows that embody aspects of the disclosure. However, it is understood that this disclosure may be practiced without these specific details. For instance, this disclosure refers to depth of cut controllers (DOCCs) on polycrystalline diamond compact (PDC) bits in illustrative examples. Aspects of this disclosure can be instead applied to DOCCs on other types of drill bits. In other instances, well-known instruction instances, protocols, structures, and techniques have not been shown in detail in order not to obfuscate the description.

Overview

Stick-slip vibration during drilling operations can contribute greatly to cutter damage of drill bits (such as polycrystalline diamond compact (PDC) bits) and early failure of downhole tools. Identification and classification of stick-slip vibration during drilling operations can be used to provide mitigation strategies for reducing stick-slip vibration during drilling because such strategies can be dependent on the type of stick-slip vibration. Stick-slip vibration can be identified by measuring bit rotational speed using a gyroscope along the bit axis. Classifying stick-slip vibration as cutting-induced or friction-induced can be dependent on the presence of coupled axial and torsional vibrations. In cutting-induced stick-slip (CSS) vibration, axial vibration and torsional vibration are coupled. In contrast, in friction-induced stick-slip (FSS) vibration, axial vibration and torsional vibration are not coupled. On bit accelerometers and gyroscopes can be used to measure axial, lateral, and torsional acceleration, and angular momentum, respectively. Collected data can then be analyzed to identify and classify stick-slip occurrences. Instances of CSS can be identified as a function of drill bit design. For example, instances of CSS can be a function of drilling efficiency (DE) for primary and backup cutters and depth of cut controller (DOCC) functional characteristics (such as DOCC contact area, weight on bit (WOB) applied to DOCCs, and torque on bit (TOB) applied to DOCCs.

Coupled axial vibrations and torsional vibrations can be correlated to drill bit design parameters. Design criteria for DOCCs in cone on a drill bit can be generated based on the presence of coupled axial and torsional vibration, DE, and DOCC functional characteristics to reduce CSS vibration. Based on the design criteria, drill bit designs can be validated or modified to minimize CSS vibration in future drilling operations. In some implementations, drilling operations can be modified in real time in response to the identification of CSS vibration.

Example System

Figure 1:
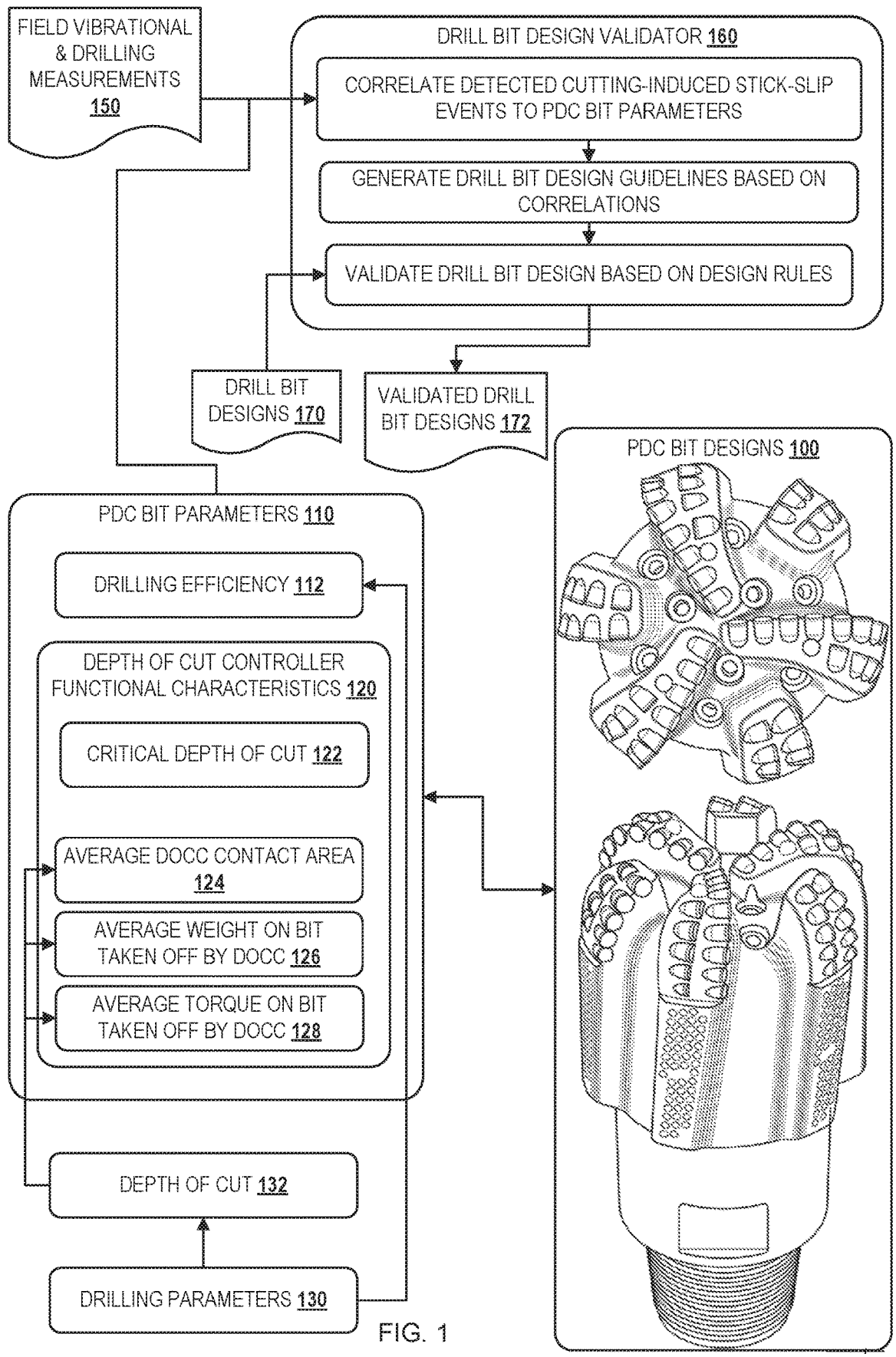
FIG. 1 illustrates an example system for correlating detected cutting-induced stick-slip vibrations and one or more drill bit design parameters in order to design drill bits that minimize the occurrence of cutting-induced stick-slip, according to some embodiments.

FIG. 1 illustrates an example system for correlating detected cutting-induced stick-slip vibrations and one or more drill bit design parameters in order to design drill bits that minimize the occurrence of cutting-induced stick-slip (CSS) vibration, according to some embodiments. Cutting torque generated by an interaction between a drill bit and a formation during drilling can contribute to CSS. Because CSS is dependent on bit design, designing bits using design parameters based on correlations between bit parameters, including functional characteristics of DOCCs, and drilling efficiency (DE) in drilling operations where CSS vibration occurred can aid in mitigating CSS vibration.

Depth of cut controllers (DOCCs) can be used to control the distance between the formation and cutters of the drill bit, including PDC bits, to reduce bit/rock interaction, act as a standoff between cutting surfaces of the drill bit, and/or reduce impact on the cutters downhole. DOCCs can be located on one or more surfaces of the drill bit, including on a roller, inside a cone of a PDC bit, or outside the cone of a PDC bit (including on the nose, taper, shoulder, or gauge, etc.). DOCCs can be impact arrestors, carbide impact arrestors (CIA), rolling or roller elements, axial arrestors, modified diamond reinforced (MDR) cutters and other secondary cutters, etc., or combinations thereof.

With reference to FIG. 1, PDC bit designs 100 can include design of a cutting structure of a drill bit and may include other features of the drill bit such as hydraulic or stabilization elements. A cutting structure can be represented by PDC bit parameters 110. Features of PDC bit design associated with CSS vibration include functional characteristics of depth of cut controller (DOCC) design and cutter design. The PDC bit parameters 110 can include design parameters and/or performance parameters for the PDC bit design. For example, design parameters can include bit dimensions, shape of bit profile, number of blades, number of cutters, type of cutters, back rake angle, side rake angle, primary cutter layout, backup cutter layout, number and location DOCCs and DOCC design, gauge pad aggressiveness, etc., which will be discussed in greater detail with reference to FIG. 2. Example performance parameters for the PDC bit design can include a drilling efficiency 112 and depth of cut controller functional characteristics 120.

The drilling efficiency (DE) 112 is given by Equation 1:

$$DE = \frac{\sigma_{rock}}{E_s} * 100\% \qquad (1)$$

where $\sigma_{rock}$ is rock compressive strength and $E_s$ is mechanical specific energy as defined as provided by Equation 2, below. $E_s$ is given in pounds per square inch (psi) as:

$$E_s = \frac{WOB}{A} + \frac{120\pi * RPM * TOB}{A * ROP} \qquad (2)$$

where A (in square inches or in$^2$) is a cross-sectional area of hole drilled by the drill bit, WOB is weight on bit, TOB is torque on bit, ROP is rate of penetration, and RPM is revolutions per minute (rev/min) of the drill bit. DE as calculated using Eqns. 1 and 2 depends on both formation information, including rock compressive strength, and on drilling parameters, including WOB, TOB, ROP, and RPM. The drilling efficiency (DE) 112 is a function of drilling parameters 130, where the drilling parameters 130 include WOB, TOB, ROP, and RPM.

The drilling efficiency (DE) 112 may be determined using measured data from a real world drilling operation. Alternatively, the drilling efficiency 112 may be a calculated theoretical value based on a subset of known bit parameters of the PDC bit parameters 110. A theoretical DE may be a function of assumed or averaged formation parameters and drilling parameters 130. The drilling efficiency 112 may also be an average drilling efficiency. The average drilling efficiency can be determined by assessing DE over a range of depths of cut (DOCs) and averaging the assessed DE values to determine the average DE, as further discussed below with reference to FIG. 7. Drill bit design rules can be determined by correlating the PDC bit parameters 110, including the drilling efficiency 112 and the depth of cut controller functional characteristics 120, to identified occurrences of CSS vibration.

The depth of cut controller (DOCC) functional characteristics 120 can include a critical depth of cut (CDOC) 122 and an average DOCC contact area 124, an average weight on bit (WOB) taken off by DOCC 126, and an average torque on bit (TOB) taken off by DOCC 128 for each in-cone DOCC of a PDC bit from the PDC bit designs 100. The average DOCC contact area 124, the average WOB taken off by DOCC 126, and the average TOB taken off by DOCC 128 are functions of a depth of cut (DOC) 132. The DOC 132 is expressed in terms of distance traveled through the formation when drilling per revolution of the drill bit (for example, inches/revolution), and is a function of one or more drilling parameters 130, which may include formation parameters, such as rock compressive strength, and operational drilling parameters, such as WOB, TOB, ROP, and RPM, as mentioned above. Similar to the drilling efficiency 112, the DOC 132 may be calculated using measured values collected during a real world drilling operation or may be calculated using theoretical values. The CDOC 122 is a DOC at which DOCCs of a bit contact a formation in which it is drilling. For DOCs greater than the CDOC 122, DOCCs on the bit are in contact with the formation. For DOCs less than the CDOC 122, DOCCs on the bit are not in contact with the formation. The CDOC 122 is a function of the PDC bit design 100 and is independent of the drilling parameters 130.

The average DOCC contact area 124 is an average of the DOCC contact area over a range of DOCs. The DOCC contact area is the area of contact between a DOCC located in the cone of the PDC bit and the formation at a specific DOC. The DOCC contact area is zero for DOCs smaller than the CDOC 122, when in-cone DOCCs are not in contact with the formation. When the DOC 132 is equal to the CDOC 122, in-cone DOCCs meet the formation. When the DOC 132 increases past the CDOC 122, the contact area for an in-cone DOCC with the formation increases as the DOCC is pushed into the formation. The force exerted by the DOCC on the formation increases as the DOCC contact area increases, resulting in an equal and opposite force from the formation on the PDC bit, controlling DOC. The average DOCC contact area 124 is calculated by averaging contact area for an in-cone DOCC over a DOC range, as will be discussed in reference to FIG. 6. The DOC range can cover from 0 in/rev, or otherwise below the CDOC 122, to a maximum DOC. The maximum DOC for a PDC bit is dependent on the number of blades in the drill bit and can be determined based on measured drilling data, as will be discussed further below with reference to FIGS. 4A-4B.

The average WOB taken off by a DOCC 126 is an average of the WOB applied to an in-cone DOCC as a percentage of the WOB applied to the drill bit over a range of DOCs. The WOB applied to the drill bit is applied to the formation by the drill bit at points of contact between the drill bit and the formation face. When the DOC 132 is smaller than the CDOC 122, the WOB taken off by a DOCC 126 is negligible because in-cone DOCCs do not contact the formation. As the DOC 132 increases beyond the CDOC 122, more WOB is applied to the DOCC as the contact area between the DOCC and the formation increases. The average weight taken off by a DOCC is given by Equation 3:

$$\overline{WOB} = \frac{WOB_{DOCC}}{WOB} * 100\% \qquad (3)$$

where $\overline{WOB}$ is the average WOB taken off by a DOCC 126 as a dimensionless percentage, $WOB_{DOCC}$ is the average WOB applied to a cone DOCC (in thousands of pounds or equivalent units), and WOB is the average WOB applied to the bit (in thousands of pounds or equivalent units). The average WOB is calculated over a DOC range for the PDC bit configuration. The relationship between the WOB taken off by a DOCC 126 and the DOC 132 will be discussed in relationship to FIG. 7.

The average TOB taken off by a DOCC 128 is an average of a TOB applied to an in-cone DOCC as a percentage of a TOB applied to the drill bit over a range of DOCs. The TOB applied to the drill bit is applied to the formation at the points of contact between the drill bit and the formation faces, including sidewalls, and can include torque lost to drag, drilling mud, or other torsional effects. When the DOC 132 is smaller than the CDOC 122, the TOB taken off by a cone DOCC 128 is negligible because cone DOCCs do not contact the formation. As the DOC 132 increases beyond the CDOC 122, more torque is applied to the DOCC as it comes into greater contact with the formation. The average TOB taken off by a DOCC 128 is given by Equation 4, below:

$$\overline{TOB} = \frac{TOB_{DOCC}}{TOB} * 100\% \qquad (4)$$

where $\overline{TOB}$ is the average TOB taken off by a DOCC 128 as a dimensionless percentage, $TOB_{DOCC}$ is the average TOB applied to the DOCC (in pound feet or equivalent units), and TOB is the average TOB applied to the bit (in pound feet or equivalent units). The average TOB is calculated over a DOC range for the PDC bit configuration. The relationship between the TOB taken off by the DOCC 128 and the DOC 132 will be discussed in relationship to FIG. 8.

The PDC bit parameters 110, including the DOCC functional characteristics 120 and the drilling efficiency 112, can be used to correlate drill bit characteristics to occurrences of cutting-induced stick-slip during drilling. Field vibrational and drilling measurements 150 for a drilling operation can be analyzed to identify instances of cutting-induced stick-slip vibration. The field vibrational and drilling measurements 150 can include vibrational data generated by an on-board vibrational measurement system of the PDC drill bit. The on-board vibrational measurements system can include accelerometers and gyroscopes to measure axial and radial acceleration and momentum. Coupled axial and torsional vibrations can be identified using the measured axial and radial accelerations, respectively, over time. These coupled axial and torsional vibrations can be correlated to irregularities in bit rotation speed, or rotations-per-minute (RPM) to identify cutting-induced stick-slip, as will be discussed further with reference to FIG. 3.

A drill bit design validator 160 can correlate the field vibrational and drilling measurements 150 with the PDC bit parameters 110 to generate drill bit design rules for future bit design to minimize cutting-induced stick-slip (CSS) vibration during a drilling operation. Based on the field vibrational and drilling measurements 150, the drill bit design validator 160 can identify instances of CSS vibration from vibrational data of the field vibrational and drilling measurements 150 for a drilling operation. The drill bit design validator 160 can operate on a set or batch of drill bit designs together with their corresponding field data and mark each drill bit design of the batch of drill bit designs based on determining the presence of CSS vibration identified from the corresponding field vibrational and drilling measurements. The drill bit design validator 160 may iteratively update or refine the drill bit design rules based on additional drill bit design and field vibrational data.

Optionally, the drill bit design validator 160 may update the drill bit design rules based on real time measurements of field vibrational and drilling measurements 150 and allow for real time adjustment of drilling parameters 130 to mitigate detected CSS vibration. The drill bit design validator 160 can correlate field vibrational and drilling measurements 150 to the PDC bit parameters 110 for the drill bit used during the field measurement.

The drill bit design validator 160 can map PDC bit parameters 110 to drilling operations with instances of detected CSS vibration and to drilling operations where no CSS vibration was detected. The drill bit design validator 160 can map detected CSS vibrations to one or more of the PDC bit parameters 110 and generate a multi-dimensional map of a drill bit design space where CSS vibrations are detected or are not detected. The drill bit design validator 160 can generate drill bit design rules based on the mapped correlations between the PDC bit parameters 110 and detected CSS vibrations. The drill bit design rules may be based on one or more of the PDC bit parameters 110. For example, the drill bit design rules may be based on the drilling efficiency 112 and one or more of the DOCC functional characteristics 120. The drill bit design rules may be based on the drilling efficiency 112, the CDOC 122, the average DOCC contact area 124, the average WOB taken off by DOCCs 126, and the average TOB taken off by DOCCs 128. The drill bit design rules may be based on the drilling efficiency 112 and cutter design. For example, the drill bit design guidelines may be based on the drilling efficiency 112 and a back rake angle of a cutter. Cutter design features can include a cutter back rake angle, a bit profile, a cutter chamfer size, layout of backup cutters, quantity of blades, etc. The drill bit design rules may be based on a relationship between two or more of the PDC bit parameters 110. For example, the drill bit design rules may be based on a relationship between the average DOCC contact area 124 and the drilling efficiency 112. The drill bit design rules may be based on a relationship between two or more of the DOCC functional characteristics 120. For example, the drill bit design rules may be based on a relationship between the CDOC 122 and the average WOB taken off by DOCC 126. The drill bit design rules may be based on one or more of the PDC bit parameters 110 and the DOC 132. For example, the bit design rules may be based on a relationship between the drilling efficiency 112 and the DOC 132. As a second example, the drill bit design rules may be based on a relationship between the drilling efficiency 112, the CDOC 122, and the DOC 132.

The drill bit design validator 160 can validate drill bit designs based on the generated drill bit design rules. Drill bit designs 170 can include data for one or more drill bits. The data for the drill bit designs 170 can include design features for the drill bit designs, including each of the PDC bit parameters 110. The data for the drill bit designs 170 can include a subset of the PDC bit parameters 110. The drill bit design validator 160 can evaluate features of the drill bit designs 170 in light of the generated drill bit design rules. The drill bit design validator 160 can select or output a subset of the drill bit designs 170 as validated drill bit designs 172. The validated drill bit designs 172 are those of the drill bit designs 170 that adhere to the drill bit design rules as generated by the drill bit design validator 160 for mitigating CSS vibration. Optionally, the drill bit design validator 160 can adjust one or more of the PDC bit parameters 110 of one or more drill bit designs of the drill bit designs 170 so that the one or more drill bit design complies with the drill bit design rules for mitigating CSS vibration. The validated drill bit designs 172 can contain additional drill bit designs that are adjusted versions of one or more of the drill bit designs 170.

Example Drill Bit

Figure 2:
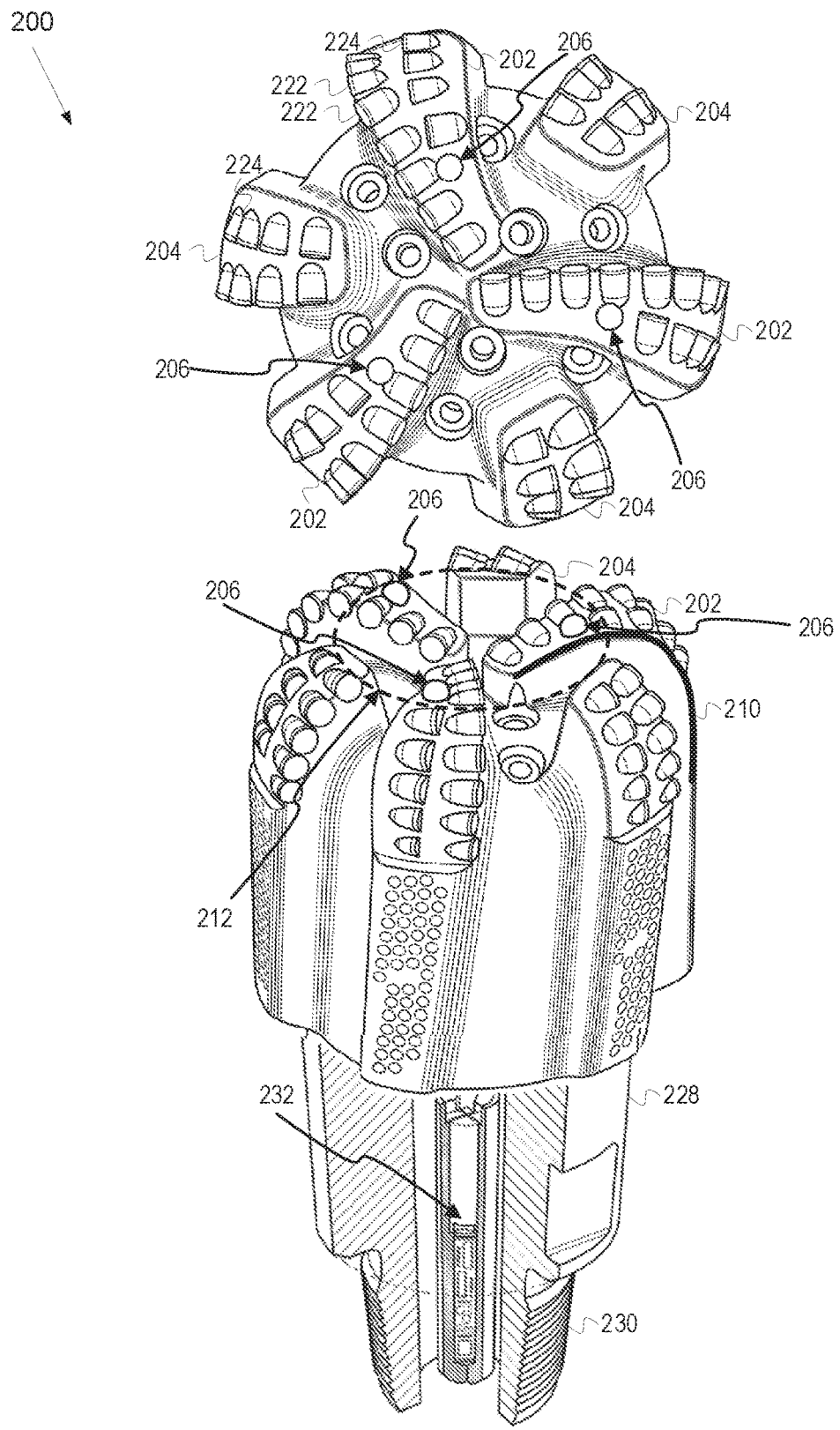
FIG. 2 depicts an example polycrystalline diamond compact (PDC) drill bit having depth of cut controllers (DOCCs) in cone, according to some embodiments.

FIG. 2 depicts an example polycrystalline diamond compact (PDC) drill bit having depth of cut controllers (DOCCs) in cone, according to some embodiments. A PDC drill bit 200 includes primary blades 202, backup blades 204, in-cone DOCCs 206, primary cutters 222, backup cutters 224, shank 228, and a pin connection 230. The in-cone DOCCs 206 are shown within a cone 212. The cone 212 corresponds to a central portion of a bit profile 210. The bit profile 210 curves inward towards the center of the PDC drill bit 200. The PDC drill bit 200 includes in-cone DOCCs 206 (only three are shown) located on each of the primary blades 202. The PDC drill bit may have greater or lesser in-cone DOCCs 206. The PDC bit can have one or more in-cone DOCCs 206 per blade, in-cone DOCCs on both the primary blades 202 and the backup blades 204, and additional DOCCs located outside the cone (not shown). The in-cone DOCCs 206 can be impact arrestors, roller cutters, modified diamond reinforcement (MDR) cutters, etc. The pin connection 230 can be a connector according to any of the specifications of the American Petroleum Institute (API), including an API Specification 7 pin connection, or another equivalent connection type. Characteristics of the in-cone DOCCs 206 can correspond to instances or likelihood of cutting-induced stick-slip (CSS) vibrations. Functional characteristics for the in-cone DOCCs 206 can be selected to mitigate CSS vibrations, based on a correlation of known DOCC functional characteristics and instances of detected CSS vibration.

An embedded vibrational measurement device 232 can be located along an axis 201 of the PDC drill bit 200. The vibrational measurement device 232 can include circuitry to be placed within the PDC drill bit 200. The vibrational measurement device may be located within the shank 228, the pin connection 230, or partially within the shank 228 and the pin connection 230. The vibrational measurement device 232 can include one or more accelerometers and gyroscopes. Drill bit vibration can be measured as a function of location (or displacement), velocity, or acceleration (including radial velocity and radial acceleration) by accelerometers and gyroscopes within the vibrational measurement device 232. The vibrational measurement device 232 may also include one or more inclinometers, temperature sensors, pressure sensors, or any other sensors to be used for collecting data downhole. The vibrational measurement device 232 can measure drill bit vibration along multiple axes. Drill bit vibration can occur along an axial axis, a lateral axis, and/or a torsional axis. The vibrational measurement device 232 can store vibrational measurements in a memory. The memory can be located within the PDC drill bit 200, within a bottom hole assembly having the PDC drill bit 200, or at a surface of a formation in which the PDC drill bit 200 is drilling. Vibrational measurements can be retrieved from the vibrational measurement device 232 and logged when the bottom hole assembly is returned to the surface. Optionally, vibrational measurements may be transmitted to a portion of the bottom hole assembly for storage, to a computer at the surface, or to a drilling controller for real-time analysis of vibrational data.

Example Graphs

Figure 3:
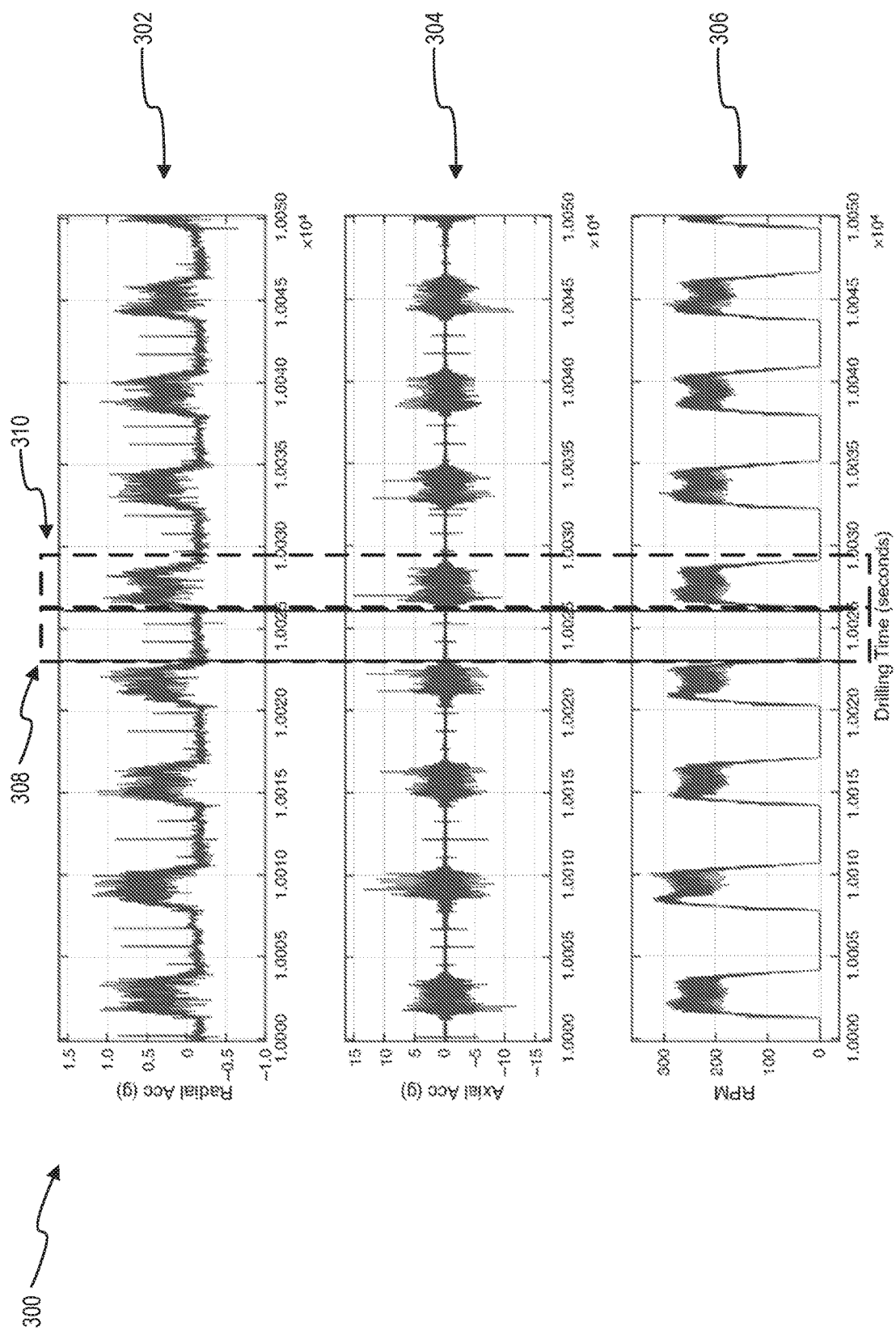
FIG. 3 depicts an example identified cutting-induced stick-slip vibration during drilling, according to some embodiments.

FIG. 3 depicts an example identified cutting-induced stick-slip vibration during drilling. Vibrational data 300 includes measured radial acceleration data, measured axial acceleration data, and measured RPM over time during a drilling operation for a drill bit. Radial acceleration graph 302 depicts radial acceleration as a function of time. Axial acceleration graph 304 depicts axial acceleration as a function of time. RPM graph 306 depicts RPM as a function of time. With reference to FIG. 1, the vibrational data 300 is an example of data that can be included in the field vibrational and drilling measurements 150. Stick-slip vibrations can be identified based on RPM graph 306. Stick-slip vibrations include a stick phase, where the bit rotational speed (RPM) is zero or approximately zero, and a slip phase, where the bit RPM increases from zero or approximately zero to a maximum bit RPM that is approximately double an average bit RPM. The average bit RPM can be determined by averaging the bit RPM over a specified time range. For example, the average bit RPM for the bit that generated the vibrational data 300 is approximately 150 RPM. The maximum bit RPM for the bit that generated the vibrational data 300 is approximately 300 RPM. The maximum RPM during a slip phase may not equal a maximum RPM of future or previous slip phases. RPM graph 306 depicts multiple stick phases and slip phases. A stick phase 308 is characterized by an RPM of zero or nearly zero. A slip phase 310 is characterized by an increase in RPM to the maximum RPM.

Stick-slip vibrations, characterized by the stick phase 308 and the slip phase 310, can be classified as cutting-induced or friction-induced. Cutting-induced stick-slip can be identified based on correlations between axial acceleration and radial acceleration during a stick-slip event that indicate coupled axial and torsional vibrations, respectively. Axial vibrations can be characterized by rapid increases and decreases in axial acceleration. Torsional vibrations can be characterized by rapid increases and decreases in radial acceleration. Both axial and torsional vibrations correspond to RPM during cutting-induced stick-slip.

With further reference to FIG. 1, the drill bit design validator 160 can analyze vibrational data 300 to determine whether cutting-induced stick-slip vibrations are present. For instance, the radial acceleration graph 302, the axial acceleration graph 304, and the RPM graph 306 correspond to a 50 second time frame during a drilling operation. The axial acceleration is correlated to the radial acceleration, and stick-slip is occurring, based on the RPM graph 306. Based on the correlated axial acceleration and radial acceleration during stick-slip events, the drill bit design validator 160 can classify the vibrational data 300 as having cutting-induced stick-slip vibrations. The drill bit design validator 160 can then correlate drill bit parameters of the drill bit to the vibrational data 300. The drill bit parameters can include one or more of the PDC bit parameters 110. For example, the drill bit parameters can include one or more DOCC functional characteristics. Alternatively, the drill bit parameters can include at least one DOCC functional characteristic and a drilling efficiency 112. The drill bit design validator 160 can generate design rules for bit design based on the vibrational data 300, as discussed with reference to FIG. 1.

Figure 4A:
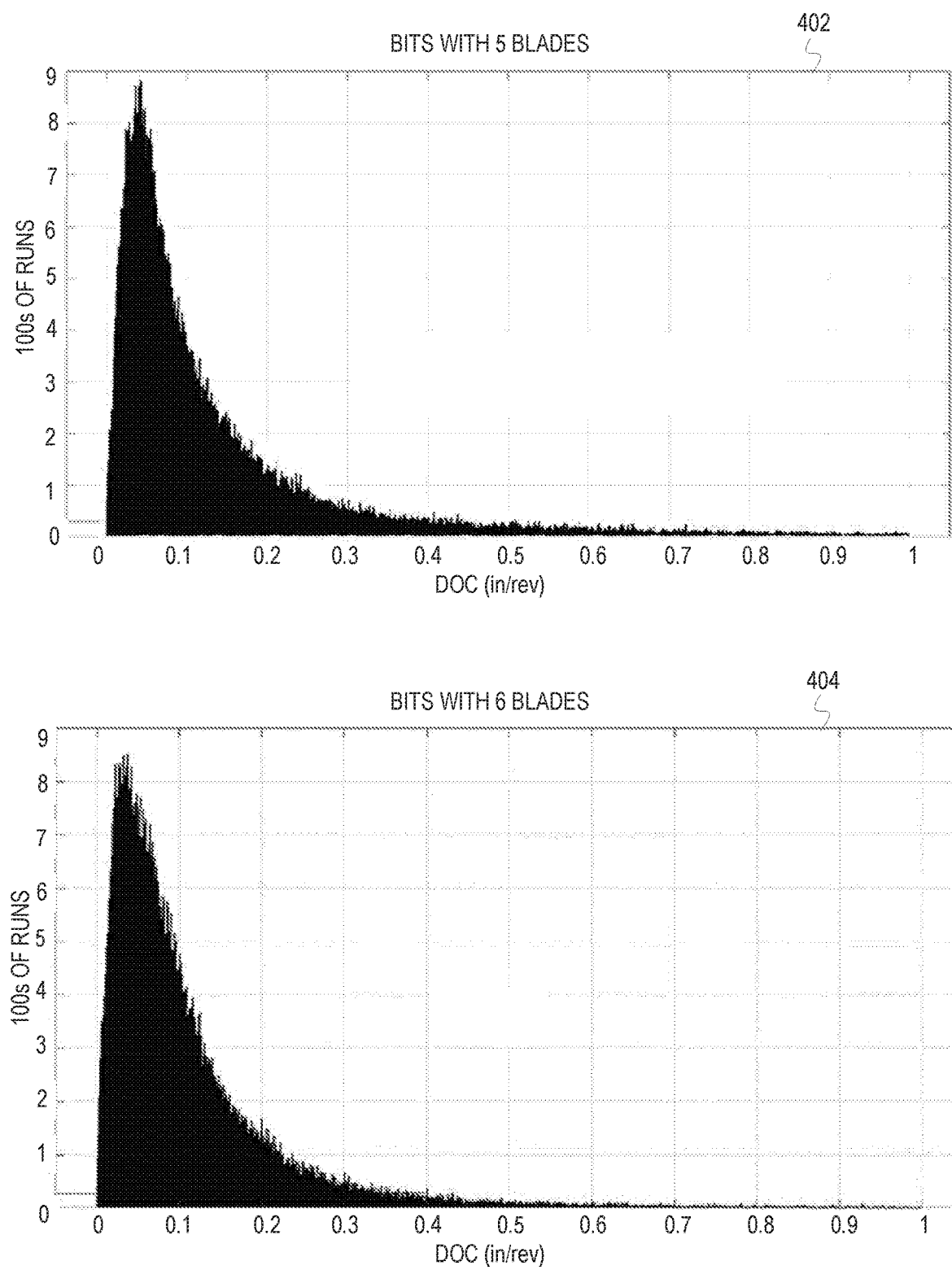
FIG. 4A depicts histograms of depth of cut (DOC) for example drilling runs for PDC bits with 5 blades and 6 blades.

FIG. 4A depicts histograms of depth of cut (DOC) for example drilling runs for PDC bits with 5 blades and 6 blades. A graph 402 depicts DOC in in/rev for PDC bits with five blades as a function of number of runs falling within each DOC interval. A total of 88776 drilling runs are included, with a mean DOC of 0.13715 in/rev and a median DOC of 0.080473 in/rev. To obtain an average DOCC contact area, an average WOB taken off by a DOCC, and an average TOB taken off by a DOCC for an in-cone DOCC, those values are averaged over realistic DOC values. A DOC range can be determined based on data from previous drilling runs with similar bits. The DOC range can be determined by PDC bit blade number. Alternatively, the DOC range can be determined based on another bit design parameter. As shown in the graph 402, measured DOCs fall within a peak such that a range can be known or selected. In this example, the distribution of DOCs is similar to a chi-squared ($\chi 2$) distribution. Based on the graph 402, for five bladed PDC bits the DOC range lies between 0 in/rev and 0.5 in/rev.

A graph 404 depicts DOC in in/rev for PDC bits with six blades as a function of number of runs within each DOC interval. 133929 runs are plotted, with a mean DOC of 0.11127 in/rev, a median DOC of 0.077108 in/rev, and a DOC range between 0 and 0.4 in/rev.

Figure 4B:
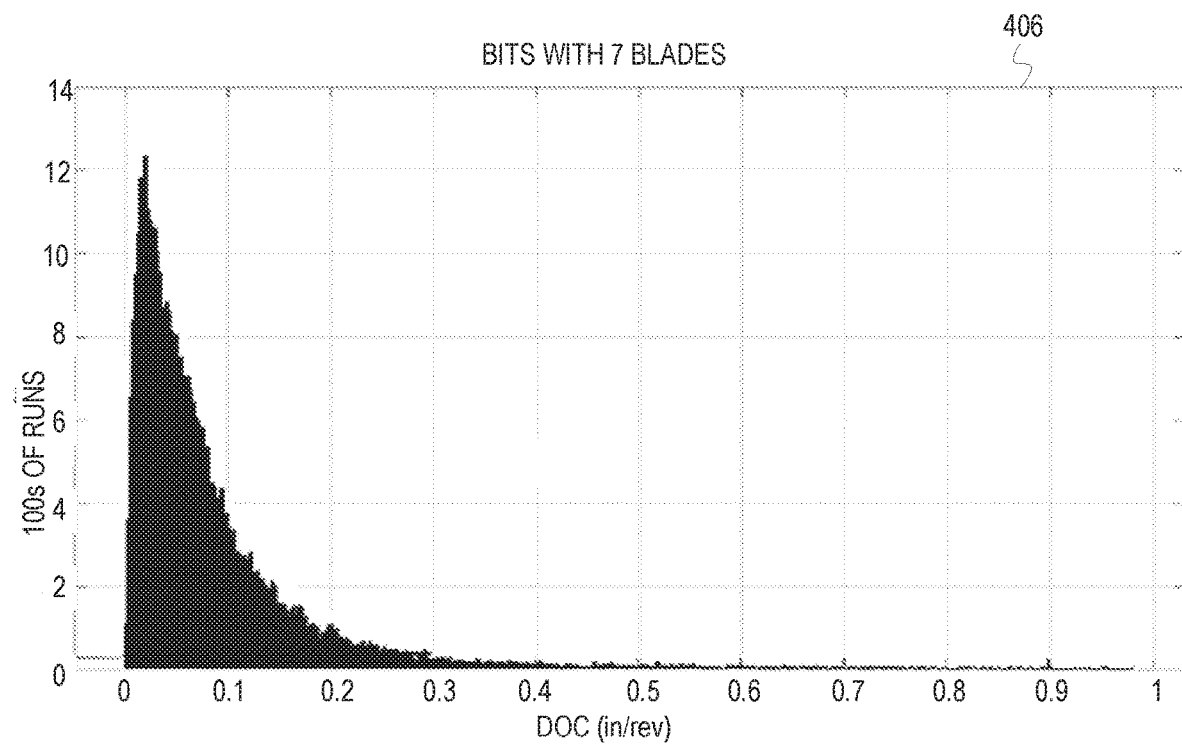
FIG. 4B depicts histograms of DOC for example drilling runs for PDC bits with 7 blades and 8 blades.
Figure 4B:
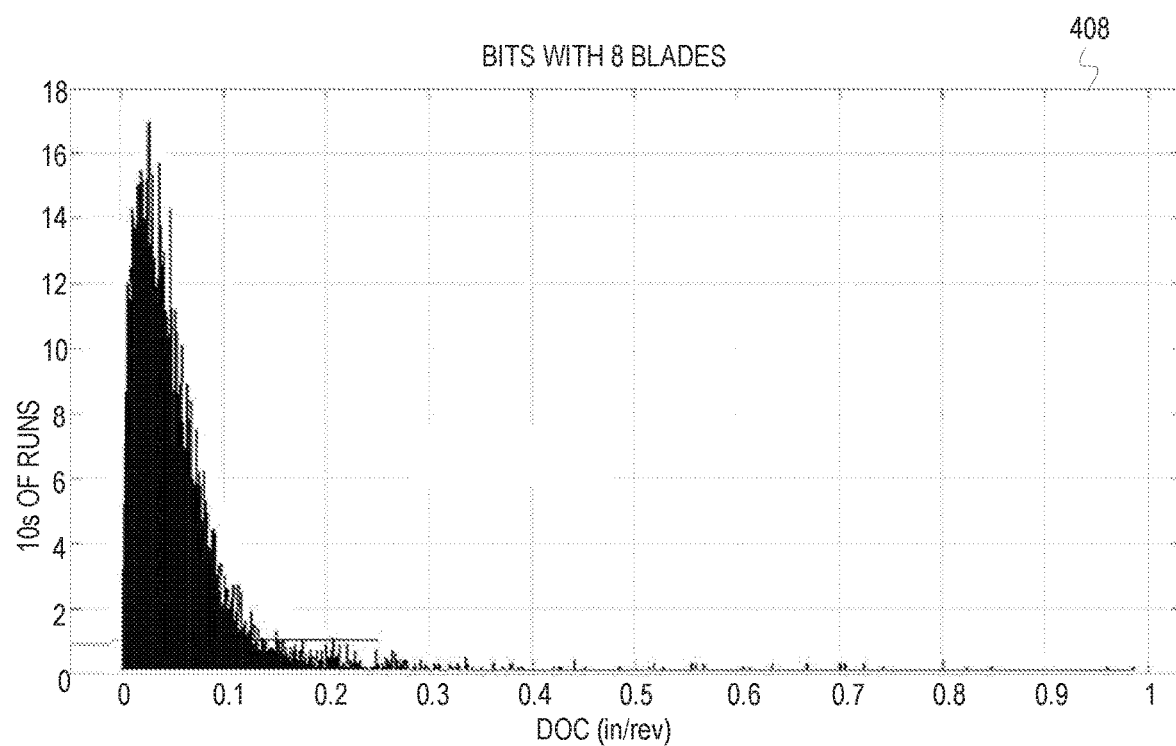

FIG. 4B depicts histograms of DOC for example drilling runs for PDC bits with 7 blades and 8 blades. A graph 406 depicts DOC in in/rev for PDC bits with seven blades as a function of number of runs for each DOC interval. 42109 runs are graphed, with a mean DOC of 0.083898 in/rev, a median DOC of 0.05612 in/rev, and a DOC range between 0 and 0.3 in/rev. A graph 408 depicts DOC in in/rev for PDC bits with eight blades as a function of number of runs within each DOC interval. 10654 runs are plotted, with a mean DOC of 0.053062 in/rev, a median DOC of 0.039761 in/rev, and a DOC range between 0 and 0.25 in/rev.

Figure 5:
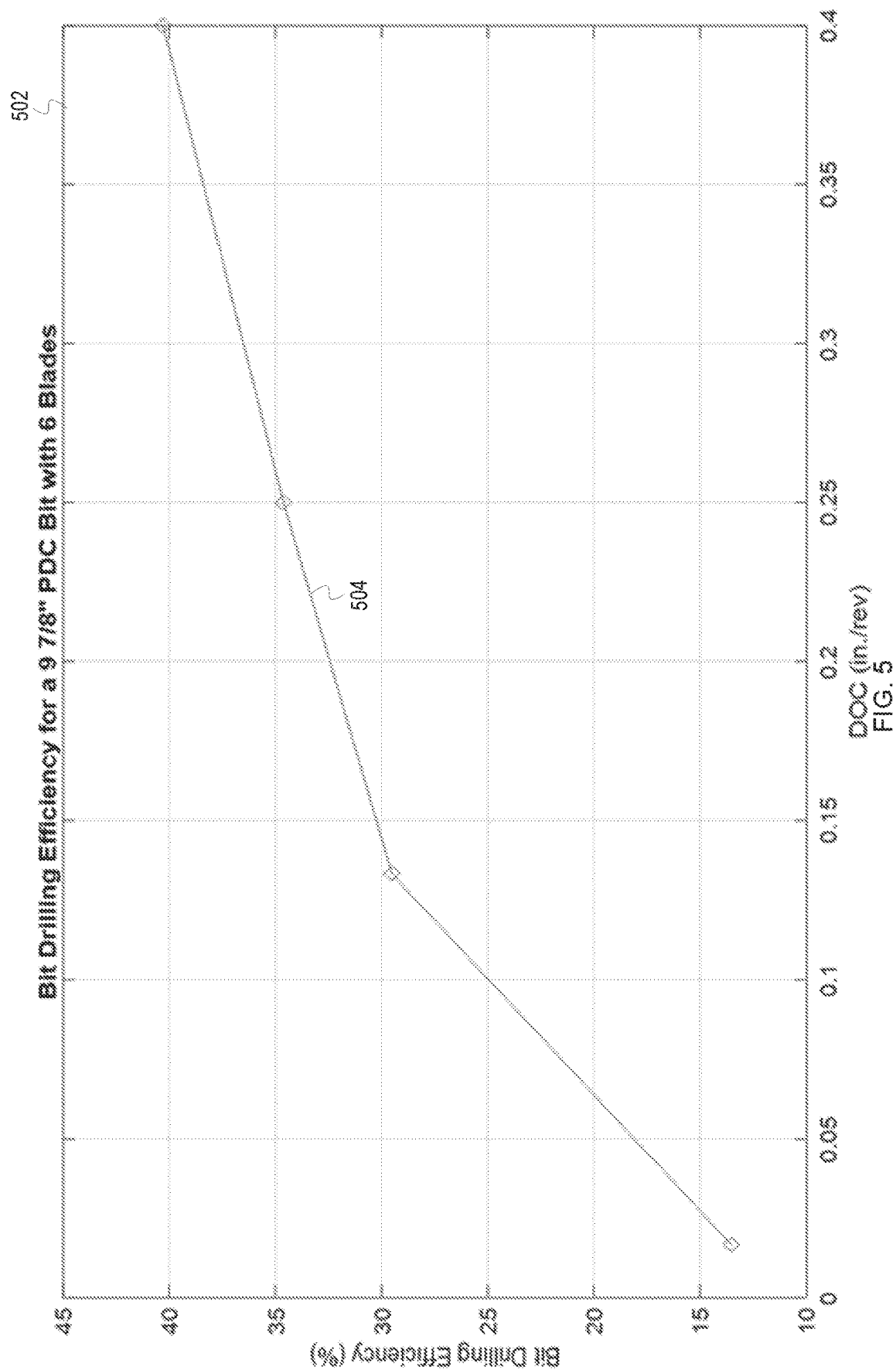
FIG. 5 illustrates an example relationship between drilling efficiency (DE) and DOC for an example PDC bit.

FIG. 5 illustrates an example relationship between drilling efficiency (DE) and DOC for an example PDC bit. A graph 502 depicts DE as a function of DOC for a 9⅞" PDC bit with six blades. A curve 504 represents a trend for bit DE as a DOC increases over a DOC range between 0 and 0.4 in/rev (which is the six blade PDC DOC range as shown in FIG. 4A). An average DE for the PDC bit can be determined by averaging the values of bit DE over the DOC range. With reference to FIG. 5 an average DE of 29.49% is calculated. Bit DE increases as DOC increases. However, other factors, such as bit wear, torque requirements, bottom-hole assembly (BHA) wear, cutting removal rate, etc., can make large DOCs economically unfavorable.

Figure 6:
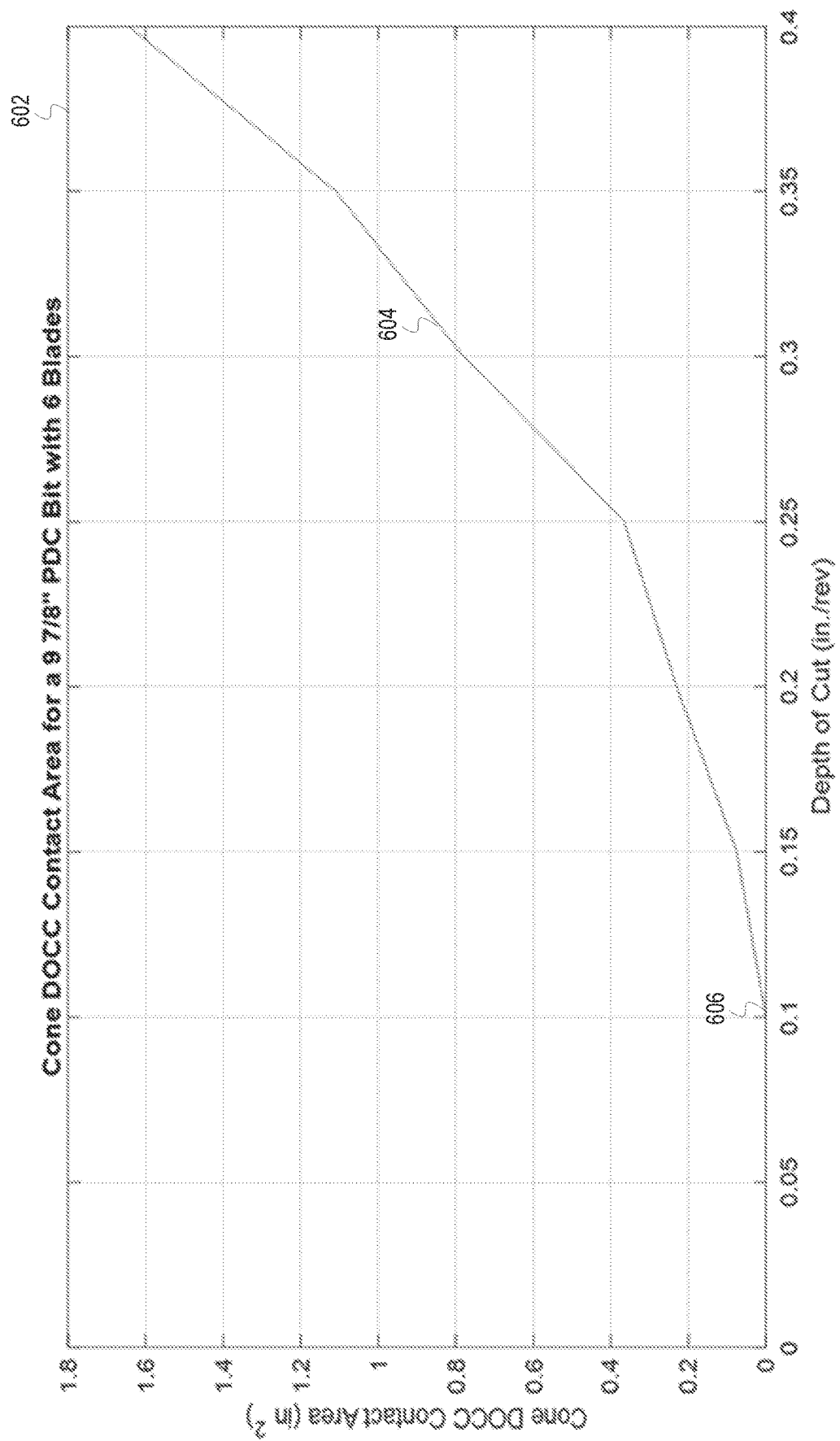
FIG. 6 illustrates an example relationship between cone DOCC contact area and DOC for an example PDC bit.

FIG. 6 illustrates an example relationship between cone DOCC contact area and DOC for an example PDC bit. A graph 602 depicts a contact area in in² for DOCCs located in a cone of a 9⅞" PDC bit with six blades in contact with a formation as a function of DOC. For a DOC smaller than a CDOC 606, contact area between the cone DOCCs and the formation is negligible. For DOCs larger than the CDOC 606, contact area increases with DOC, as shown by curve 604. The CDOC 606 is approximately 0.1 in/rev. An average contact area for DOCCs in the cone of a PDC bit can be determined by averaging sizes of the contact area over the appropriate DOC range. With reference to FIG. 6, the DOC range is 0 to 0.4 in/rev for a 6 blade PDC bit, and the average contact area of 0.3505 in².

Figure 7:
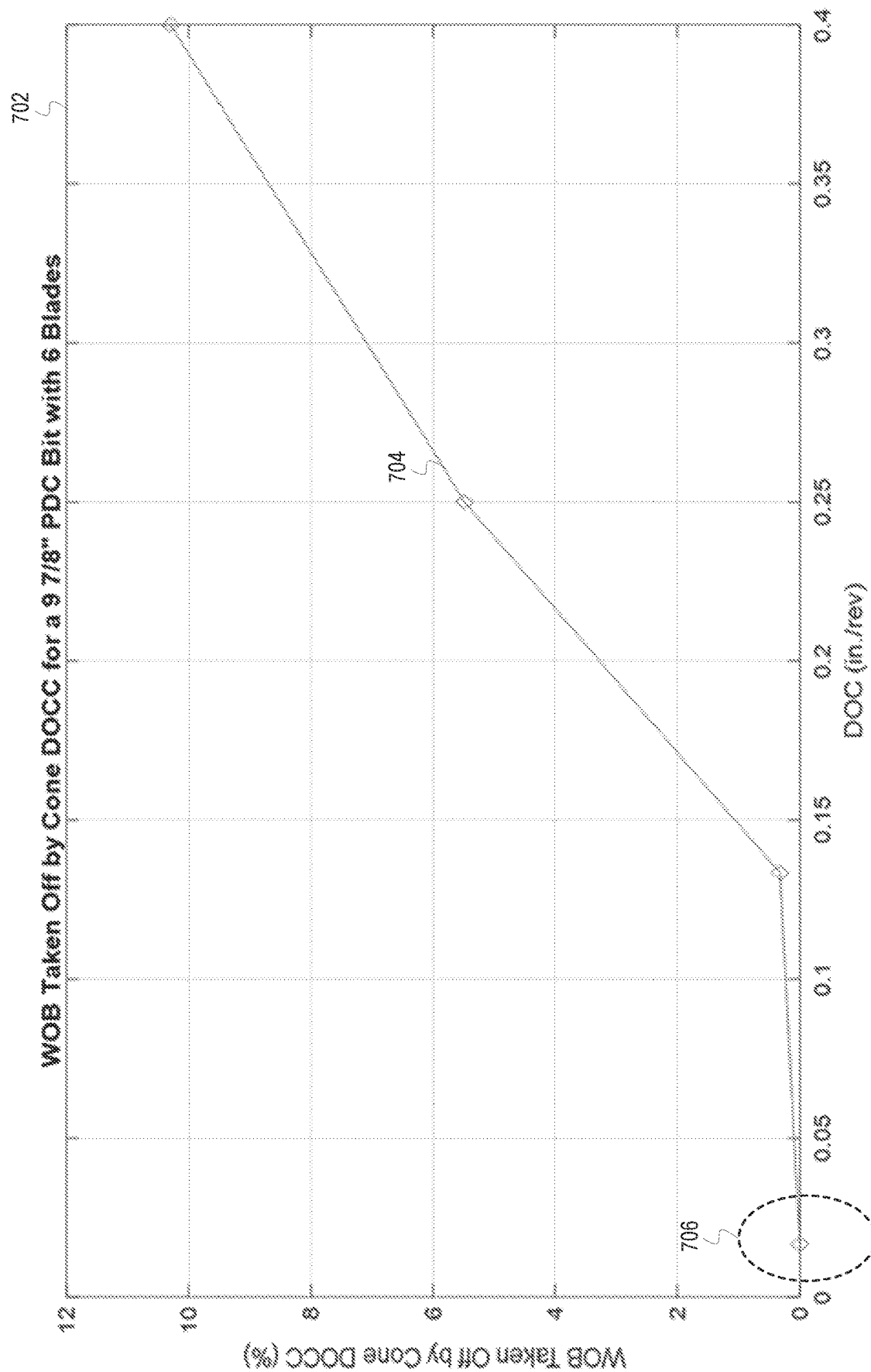
FIG. 7 illustrates an example relationship between weight on bit (WOB) taken off by a cone DOCC and DOC for an example PDC bit.

FIG. 7 illustrates an example relationship between weight on bit (WOB) taken off by a cone DOCC and DOC for an example PDC bit. A graph 702 depicts a percentage of a WOB taken off by an in-cone DOCC for a 9⅞" PDC bit with six blades as a function of DOC in in/rev. The WOB taken off by a cone DOCC increases with DOC as shown by a curve 704—WOB taken off by a cone DOCC increases as the DOCC comes into greater contact with a formation, where contact area also increases as a function of DOC (as shown in FIG. 6). For DOCs smaller than a CDOC, the WOB taken off by a cone DOCC is negligible. For example, a point 706 indicates a DOC of approximately 0.2 in/rev that corresponds to 0% WOB taken off by a cone DOCC, and where the DOCC is not in contact with the formation. In a DOC range below the CDOC, the DOCC does not influence DOC. However, as the DOC increases beyond the CDOC, the WOB taken off by a cone DOCC increases. An average WOB taken off by a cone DOCC can be determined by averaging the WOB taken off by a cone DOCC over a DOC range. In this example, over a DOC range between 0 and 0.4 in/rev for the six bladed PDC bit, the average WOB taken off by a cone DOCC is calculated as 4.03%.

Figure 8:
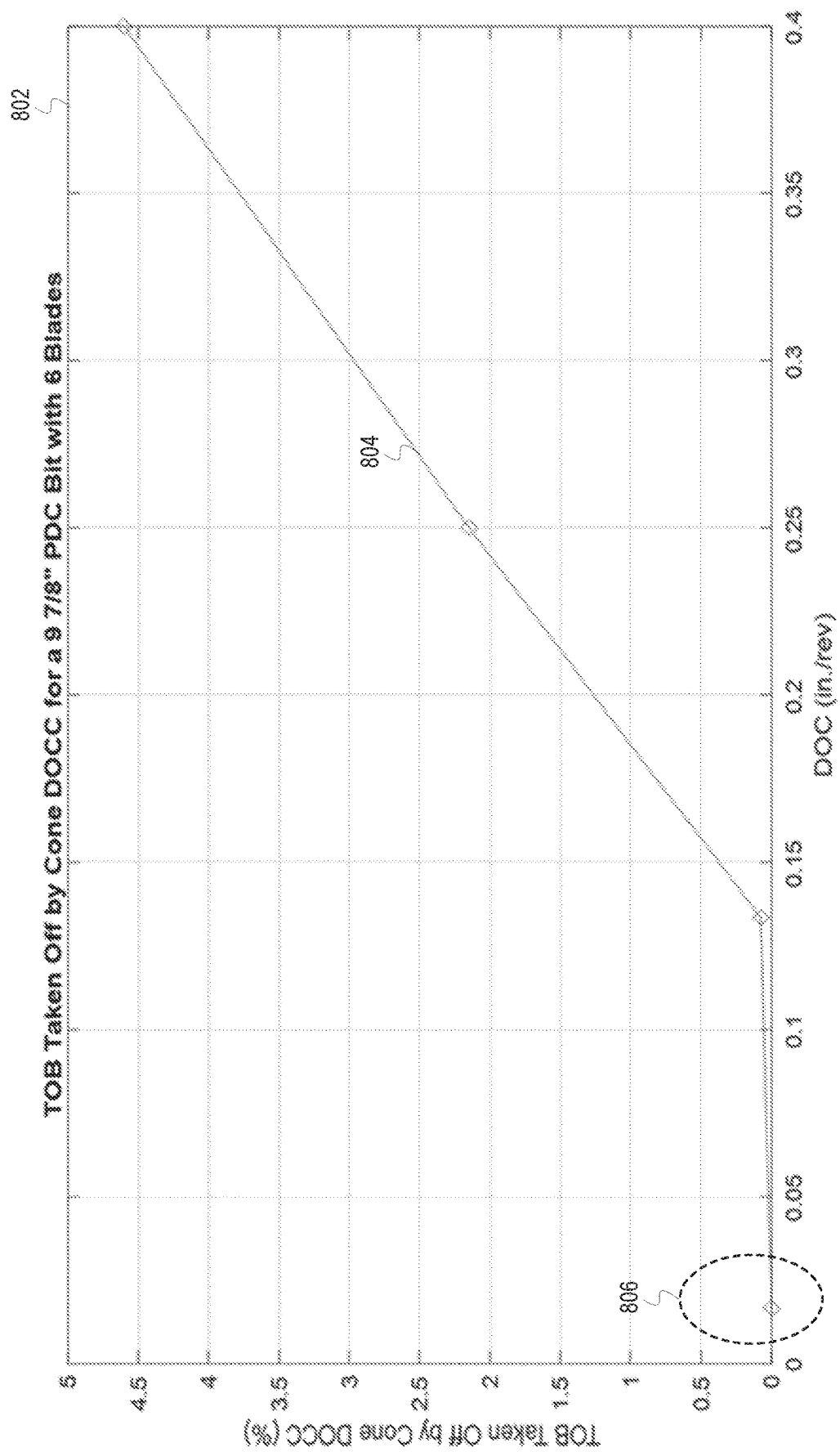
FIG. 8 illustrates an example relationship between torque on bit (TOB) taken off by a cone DOCC and DOC for an example PDC bit.

FIG. 8 illustrates an example relationship between torque on bit (TOB) taken off by a cone DOCC and DOC for an example PDC bit. A graph 802 depicts a percentage of a TOB taken off by a cone DOCC for a 9⅞" PDC bit with six blades as a function of DOC. The TOB taken off by an in-cone DOCC increases with DOC when the DOC is larger than a CDOC, as shown by a curve 804. For a DOC smaller than the CDOC, the TOB taken off by a cone DOCC is negligible. For example, a point 806 indicates a DOC of approximately 0.2 in/rev that corresponds to 0% of TOB taken off by a cone DOCC. By averaging the TOB taken off by a cone DOCC over a DOC range, an average TOB taken off by a cone DOCC can be calculated. In this example, over a DOC range of 0-0.4 in/rev (for a six blade PDC bit as shown in FIG. 4A), the average TOB taken off by a cone DOCC is calculated as 1.71%.

Figure 9:
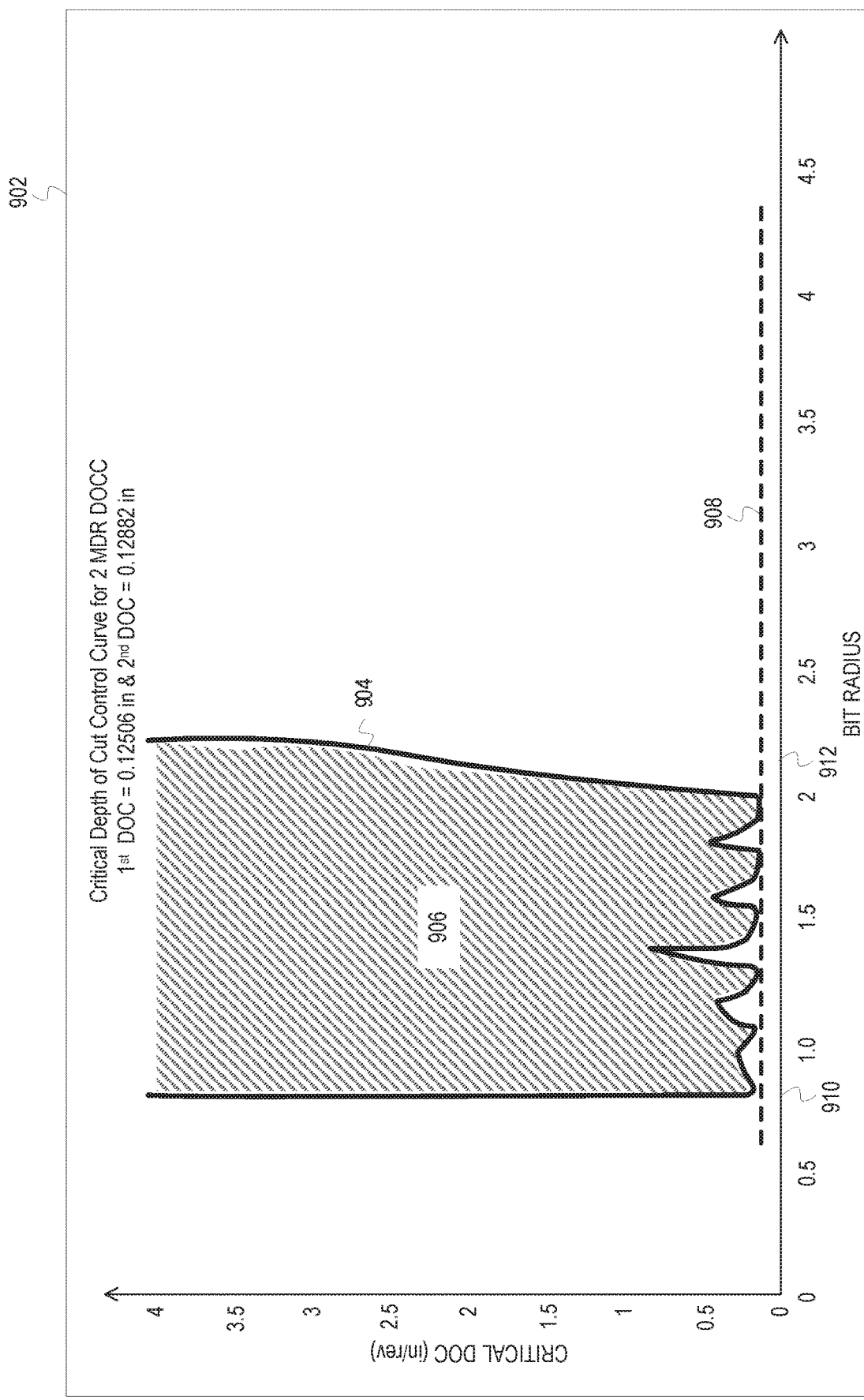
FIG. 9 illustrates an example relationship between critical depth of cut (CDOC) and depth control for an example PDC bit.

FIG. 9 illustrates an example relationship between critical depth of cut (CDOC) and depth control for an example PDC bit. A graph 902 depicts CDOC and DOCC engagement as a function of DOC in in/rev and location of DOCCs on a bit radius in inches (in) for an example PDC bit that contains two in-cone MDR-type DOCCs located on each blade. MDRs can function as cutters and/or depth of cut controllers. In this example, the MDRs act to provide depth of cut control. A first DOCC has a CDOC of 0.12506 in and a second DOCC has a CDOC of 0.12882 in. A minimum CDOC, which is represented by a curve 904, for the bit varies as a function of the MDR placement along the bit radius, which is a function of DOCC design. Within an MDR engagement zone 906, MDRs are in contact with a formation and can function to control the DOC. Outside of the MDR engagement zone 906, the two in-cone MDRs do not control the DOC—this is the non-controlled zone. A minimum CDOC is shown by dashed line 908, where the first DOCC comes in contact with the formation. A radius 910 indicates the most central location of the DOCCs on a blade, while a radius 912 represents a nose or taper of the PDC bit. As the DOCCs are positioned further from the center of the bit (i.e. as bit radius increases beyond the radius 912), the CDOC increases because the DOCCs are further from a formation face that represents a borehole floor.

The CDOC can be both a PDC bit design and performance parameter and a DOCC design parameter. As shown in FIG. 9, the CDOC can be influenced by the placement of DOCCs on a PDC bit within the cone. The CDOC can also be influenced by the number of DOCCs used (such as a pair of DOCCs versus a single DOCC) and by the DOCC size and projection from the bit surface or bit profile.

Figure 10:
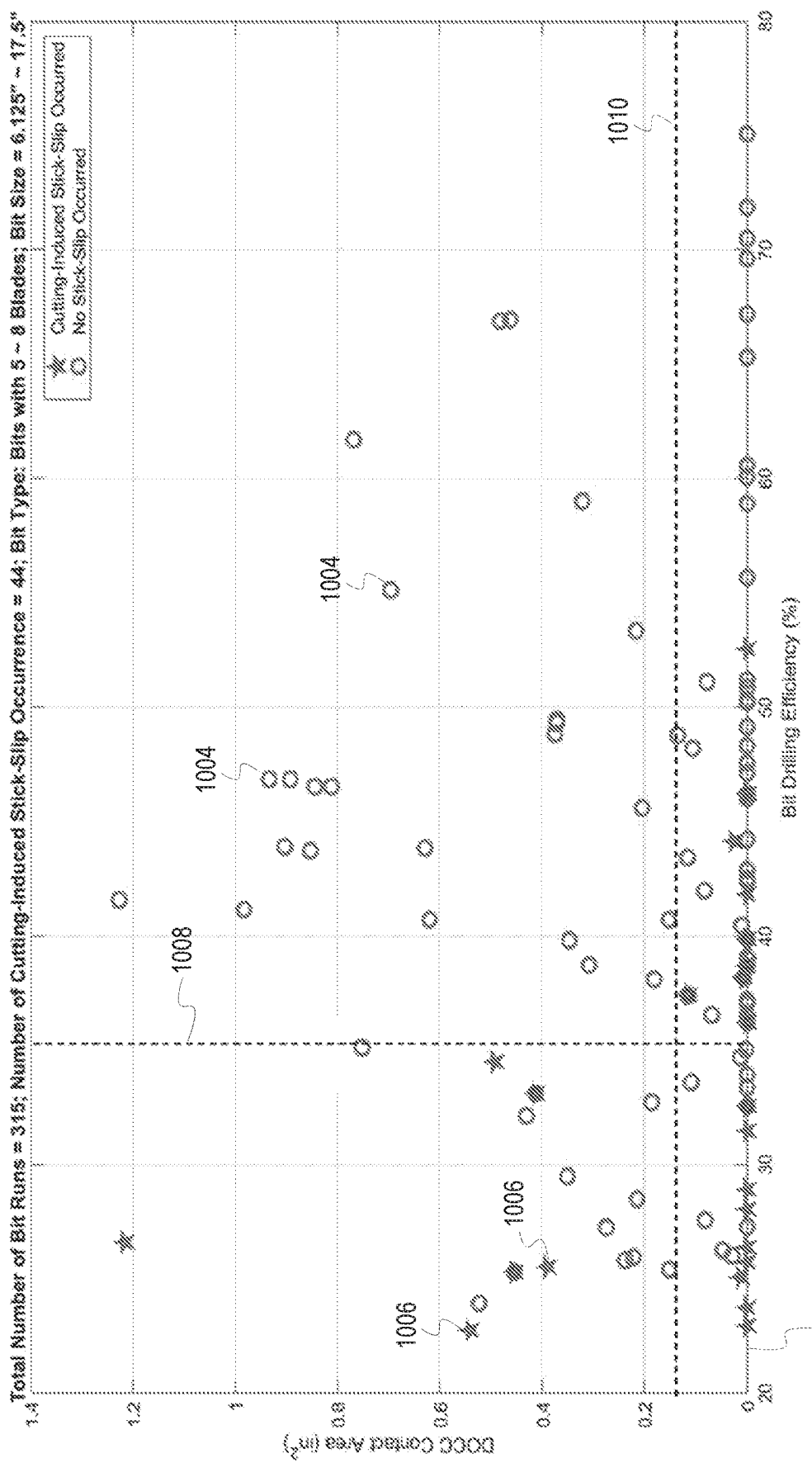
FIG. 10 depicts an example graph of detected cutting-induced stick-slip (CSS) vibrations as a function of average DOCC contact area and bit DE.

FIG. 10 depicts an example graph of detected cutting-induced stick-slip (CSS) vibrations as a function of average DOCC contact area and bit DE. A graph 1002 depicts a plot of 315 drilling runs as a function of bit DE (in %) and DOCC contact area (in in$^2$). Drilling runs where no CSS vibrations were detected are represented by circles 1004, while 44 drilling runs where CSS vibrations were detected are represented by stars 1006. PDC bits with five to eight blades and bit sizes between 6.125" and approximately 17.5" were used for the drilling runs plotted. Based on the prevalence of drilling runs with CSS vibrations and those without, CSS vibration mitigation rules can be developed. A line 1008 divides drilling runs with a bit DE less than 35% and drilling runs with a bit DE greater than 35%. A line 1010 divides drilling runs with an average cone DOCC contact area was greater than 0.15 in$^2$ and drilling runs with an average cone DOCC contact area below 0.15 in$^2$. In the upper right quadrant of the graph 1002, no drilling runs with CSS vibrations were detected. Therefore, CSS vibrations can be mitigated for DE greater than 35% and an average cone DOCC contact area greater than 0.15 in$^2$. With reference to FIG. 1, the drill bit design validator 160 may generate design rules including a lower limit for a bit DE and/or a lower limit for an average cone DOCC contact area. For this example, the drill bit design validator 160 may validate drill bit designs 170 that have an average cone DOCC contact area greater than 0.15 in$^2$ and a bit DE greater than 35%.

Figure 11:
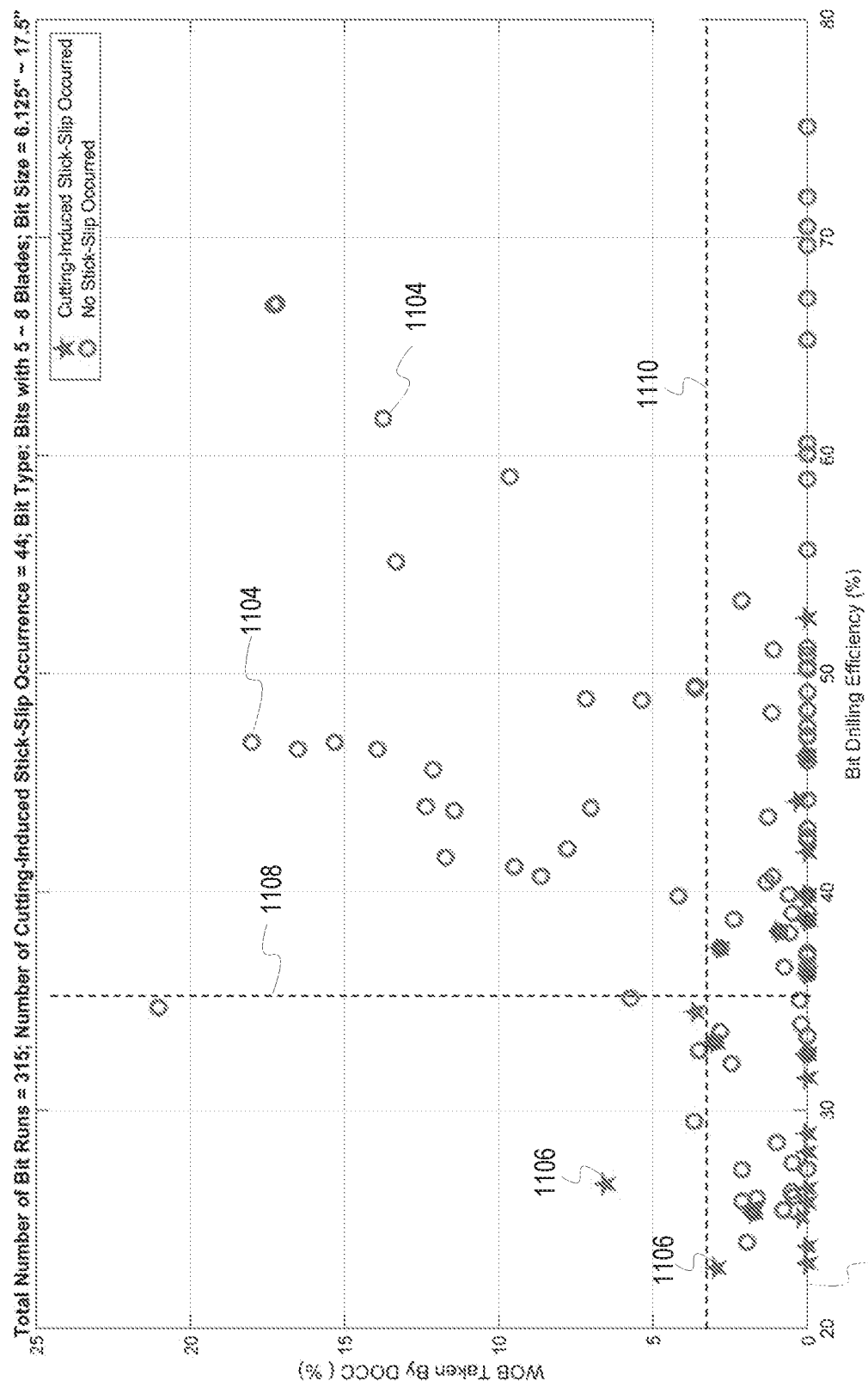
FIG. 11 depicts an example graph of detected CSS vibrations as a function of average WOB taken off by a cone DOCC and bit DE.

FIG. 11 depicts an example graph of detected CSS vibrations as a function of average WOB taken off by a cone DOCC and bit DE. A graph 1102 depicts a plot of 315 drilling runs, where CSS vibrations were detected in 44 of those drilling runs. Drilling runs were accomplished with PDC bits ranging in size between 6.125" and approximately 17.5" and with five to eight blades. Drilling runs without CSS vibrations are plotted as the circles 1004, while drilling runs with CSS vibrations are plotted as the stars 1006. Based on plotted locations for drilling runs with CSS vibrations, PDC bit design rules can be generated in a bit DE vs. average WOB taken off by a cone DOCC design space. A line 1108 divides drilling runs with a DE less than 35% and drilling runs with a DE greater than 35%. A line 1110 divides drilling runs with an average WOB taken off by a DOCC greater than 3% and drilling runs with an average WOB taken off by a DOCC less than 3%. No drilling runs with CSS vibrations were detected in the upper right quadrant, where the DE is greater than 35% and the average WOB taken off by a cone DOCC is greater than 3%. Therefore, CSS vibrations can be mitigated for a bit DE greater than 35% and an average WOB taken off by a cone DOCC greater than 3%. With reference to FIG. 1, the drill bit design validator 160 may generate design rules including a lower limit for a bit DE and/or a lower limit for an average WOB taken off by a cone DOCC. For this example, the drill bit design validator 160 may validate drill bit designs 170 that have an average WOB taken off by a cone DOCC greater than 3% and a bit DE greater than 35%.

Figure 12:
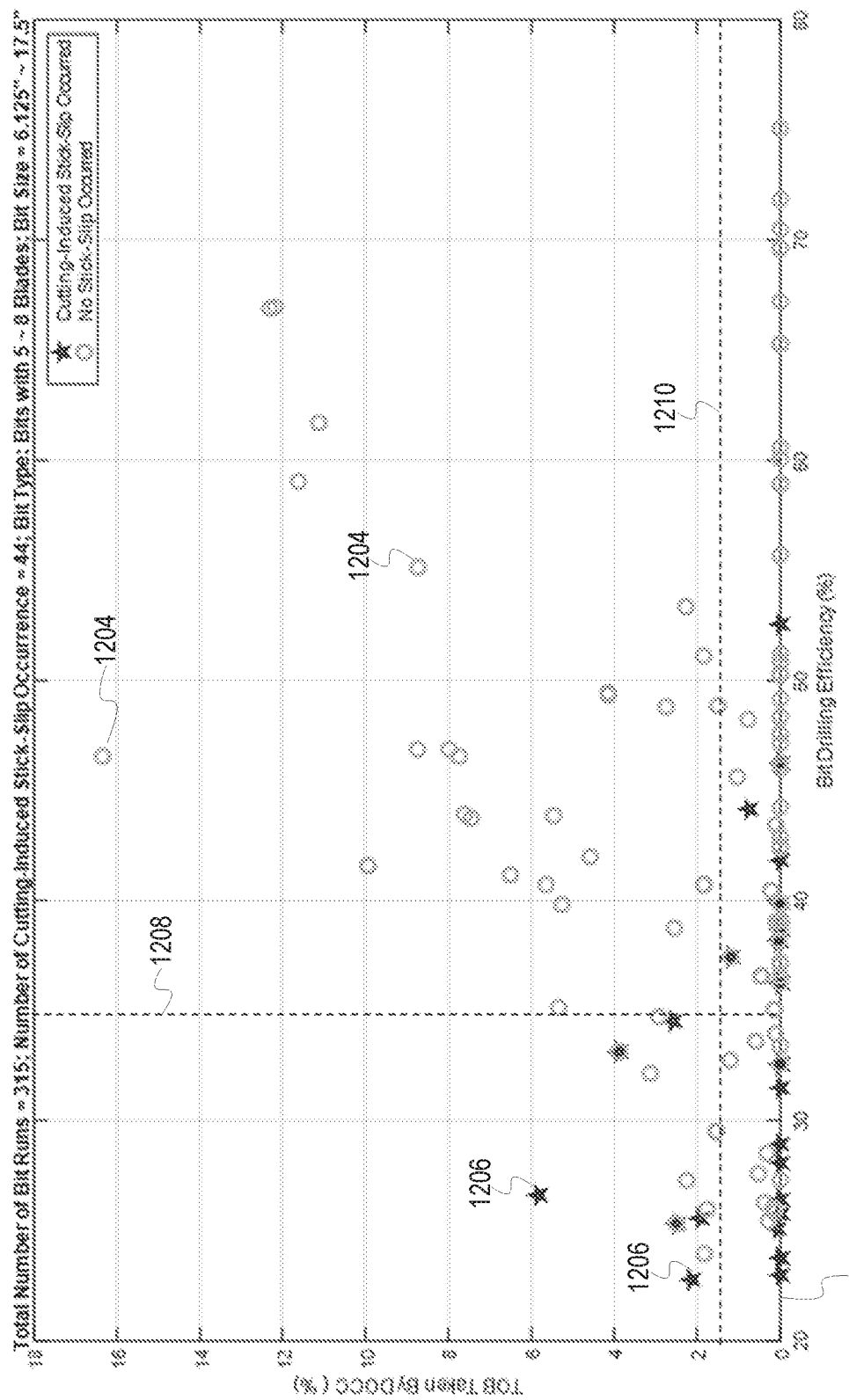
FIG. 12 depicts an example graph of detected CSS vibrations as a function of average TOB taken off by a cone DOCC and bit DE.

FIG. 12 depicts an example graph of detected CSS vibrations as a function of average TOB taken off by cone DOCCs and bit DE. A graph 1202 displays a plot of 315 drilling runs for PDC bits with five to eight blades and bit sizes of 6.125" to approximately 17.5". Drilling runs without CSS vibrations are represented as the circles 1004, while drilling runs with CSS vibrations are represented by the stars 1006. A line 1208 divides drilling runs with DE greater than 35% and drilling runs with DE smaller than 35%. A line 1210 divides drilling runs with an average TOB taken off by a cone DOCC greater than 1.5% and drilling runs with an average TOB taken off by a cone DOCC less than 1.5%. No drilling runs with CSS vibrations were detected in the upper right quadrant of the graph 1202, where DE is greater than 35% and the average TOB taken off by a cone DOCC is greater than 1.5%. Therefore, CSS vibrations can be mitigated for a bit DE greater than 35% and an average TOB taken off by a cone DOCC greater than 1.5% of TOB. With reference to FIG. 1, the drill bit design validator 160 may generate design rules including a lower limit for a bit DE and/or a lower limit for an average TOB taken off by a cone DOCC. For this example, the drill bit design validator 160 may validate drill bit designs 170 that have an average TOB taken off by a cone DOCC greater than 1.5% and a bit DE greater than 35%.

Average characteristics of a PDC drill bit design for mitigating or avoiding CSS vibrations can be calculated from a set of drilling data including vibrational data. As an example, data from the same set of drilling runs is included in FIGS. 10, 11, and 12 (i.e. the same 315 runs for PDC drill bits with five to eight blades and bit size from 6.125" to 17.5"). Based on this data set, preferred PDC bit parameters, including preferred DOCC functional characteristics, for CSS vibration mitigation can be calculated as a function of number of blades. For bits with five blades, where the DOC range is between 0 and 0.5 in/rev and where CSS vibrations were not detected, preferred PDC bit parameters include an average CDOC less than 0.3 in/rev, an average cone DOCC contact area approximately equal to 0.3065 in$^2$, the average WOB taken off by a cone DOCC of approximately 6.0852%, and an average TOB taken off by a cone DOCC of approximately 5.0779%. For bits with six blades, where the DOC range is between 0 and 0.4 in/rev and where CSS vibrations were not detected, preferred PDC bit parameters include an average CDOC less than 0.29 in/rev, an average cone DOCC contact area greater than 0.3921 in$^2$, an average WOB taken off by a cone DOCC greater than 4.8893%, and an average TOB taken off by a cone DOCC greater than 3.2877%. For bits with seven or eight blades, where the DOC range is between 0 and 0.3 in/rev and where CSS vibrations were not detected, preferred PDC bit parameters include an average CDOC less than 0.25 in/rev, an average DOCC contact area greater than 0.28 in$^2$, an average WOB taken off by a cone DOCC greater than 2%, and an average TOB taken off by a cone DOCC greater than 1.5%.

Design rules can be exclusionary, such as a bit DE greater than 35%, or can be based on averages or intervals, such as an average TOB taken off by a cone DOCC ~3.2%. It should be noted that the cone DOCC contact area, the WOB taken off by a cone DOCC, and the TOB taken off by a cone DOCC can be interrelated quantities. Design rules or guidelines can be generated based on one or more of these quantities. Design rules can also comprise both minimal threshold values and preferred ranges for one or more PDC bit parameters. For example, based on the data included in FIGS. 10-12, a bit DE greater than 35% can mitigate cutting-induced stick-slip vibrations; minimum threshold values can include an average cone DOCC contact area greater than 0.15 in$^2$, an average WOB taken off by a cone DOCC greater than 3%, and/or an average TOB taken off by a cone DOCC greater than 1.5%. Average PDC bit parameters from drilling runs without vibration can be selected as preferred values, such as those values discussed in the previous paragraph. The values given here and with reference to FIGS. 10-12 are examples and thresholds and functions can vary. However, the design rules can include a minimum bit DE and at least one quantity relating to cone DOCC design of an average DOCC contact area, a WOB taken off by a cone DOCC, and a TOB taken off by a cone DOCC. The design rules can include a bit DE and more than one of the listed DOCC design values. For example, the design rules can include a minimum DE, a minimum average DOCC contact area, and a minimum WOB taken off by a cone DOCC. Additionally, the design rules may include all four of the above values.

Example Operations

Figure 13:
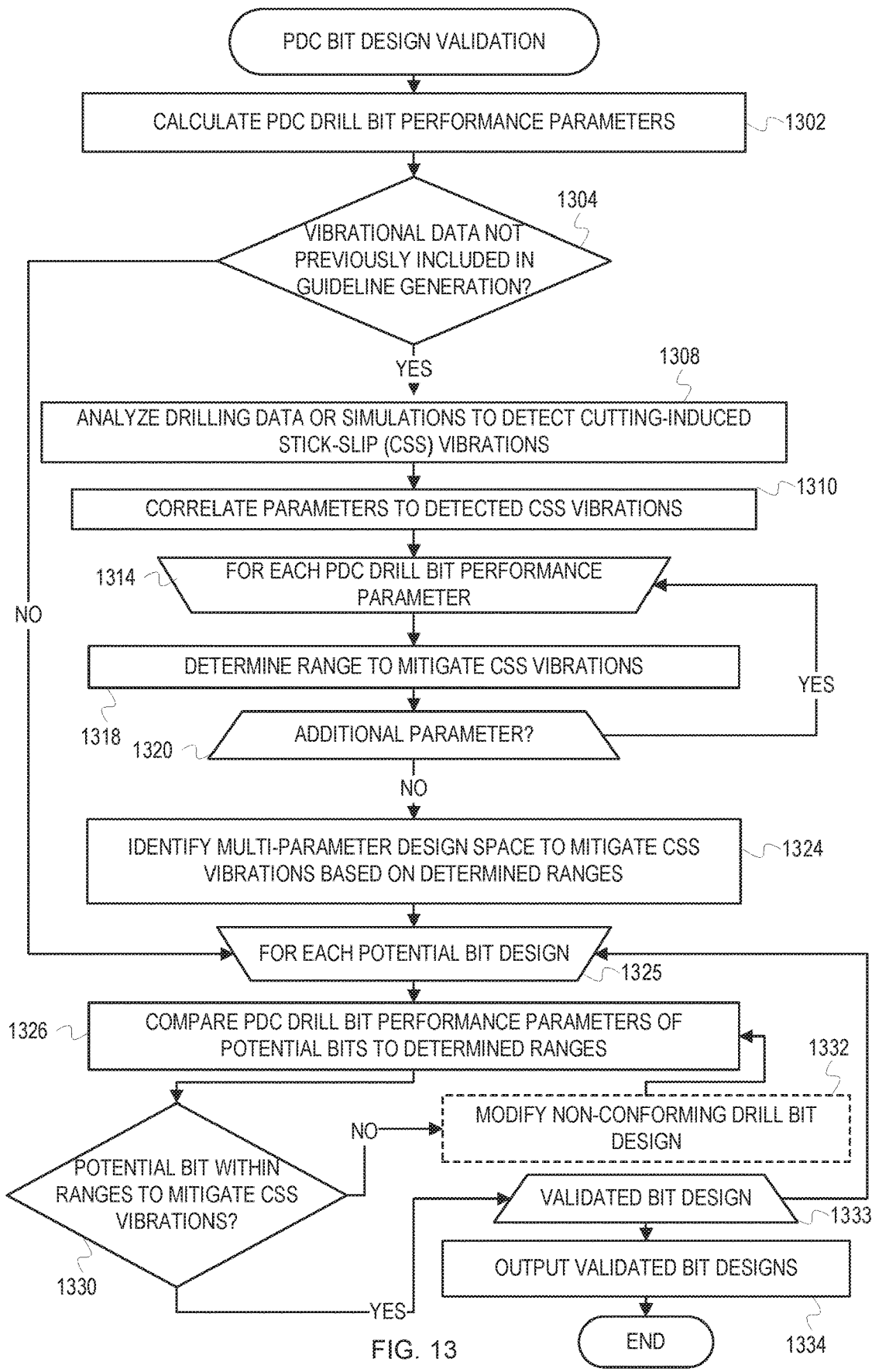
FIG. 13 is a flowchart of example operations quantifying PDC drill bit and cone DOCC design parameters for a drill bit design, according to some embodiments.

FIG. 13 is a flowchart of example operations quantifying PDC drill bit performance parameters, including cone DOCC functional characteristics, for a drill bit design, according to some embodiments. A drill bit design validator can contain or be in communication with a drill bit design quantifier, which will be described in reference to FIG. 14. Optionally, the drill bit design validator can update previously generated drill bit design guidelines based on new drilling data.

At block 1302, the drill bit design validator calculates PDC drill bit performance parameters, including in-cone DOCC functional characteristics. The drill bit design validator can receive the PDC drill bit performance parameters from the drill bit design quantifier, can send detected drill bit designs to the drill bit design quantifier, or can include the drill bit design quantifier. The drill bit design validator can select each drill bit for which new vibrational data is found at block 1302 and quantify the drill bit performance parameters via the drill bit design quantifier. Quantify, quantifier, quantification and any grammatical form thereof hereafter mean to make explicit a numerical value or other variable value for a design parameter or other bit characteristic that may or may not correlate directly or naturally to a single numerical value. For example, DOC is a function of changing drilling parameters and of many variables involved in drill bit design. The DOC can be represented as at least one of a DOC range or CDOC.

PDC drill bit designs (including optional in-cone DOCCs) correspond to a plethora of quantifiable and adjustable measurements, dimensions, and angles including drill bit radius, cutter dimensions, number of cutters, rake angles, DOCC radial locations, etc. For simplicity, drill bit characteristics will be used herein after to refer to the totality of measurable or adjustable dimensions, quantities, angles, types of components, etc. Drill bit characteristics can include DOCC functional characteristics and other bit performance parameters, such as a drilling efficiency. It can be impractical to correlate such a plurality of possible performance characteristics to detected or observed drilling behavior. In order to correlate PDC drill bit and in-cone DOCC designs to instances of CSS vibrations, a PDC drill bit and its corresponding in-cone DOCC design is correlated to one or more drill bit performance parameters that quantify and correspond to other sets or subsets of drill bit design characteristics, like DOCC functional characteristics. Drill bit performance parameters can be used to group PDC drill bit designs by shared characteristics (such as by number of blades) and allow for the correlation of overall effects of individual PDC drill bit design characteristics to drilling events.

At block 1304, the drill bit design validator determines if there is any new vibrational or drilling data with which to generate CSS mitigation drill bit design rules. If there is no new data, flow continues to block 1326 and drill bit designs are validated based on previous or stored rules. If there is new data or no previously established design rules, for example when drill bit design rules are initially generated based on a set of drilling data, flow continues to block 1308.

At block 1308, the drill bit design validator analyzes drilling data from either real-world drilling measurements or from simulated drilling data and detects instances of CSS vibration. Cutting-induced stick-slip (CSS) vibration is detected from measurements of axial and torsional oscillation of the drill bit or BHA. Individual drilling runs can correspond to both the detection and the absence of CSS vibration. Drilling runs can be marked as having CSS vibration if any instance of CSS vibration is detected. Optionally, different types of coupled vibrations or stick-slip vibrations can be identified.

At block 1310, the drill bit design validator correlates PDC drill bit performance parameters, including DOCC functional characteristics, of bits of the drilled or simulated drilling data to drilling runs with CSS vibration and drilling runs without CSS vibration. The drill bit design validator can identify the drill bit performance parameters that correspond to drilling runs with detected vibrations. Alternatively, the drill bit validator can bin, batch, or group drilling run data into a set of drilling runs with detected CSS vibrations and a set of drilling data without detected CSS vibrations. The relationship can be a one to one determination of detected CSS vibrations for a set of drill bit performance parameters or can be a probability or likelihood of CSS vibrations based on detected CSS vibrations for similar drill bit performance parameter values. For each drill bit performance parameter of each drill bit and its corresponding drilling run, calculated values are identified as corresponding to an instance of detected CSS vibration or as corresponding to no detected CSS vibration.

At block 1314, the drill bit design validator selects one drill bit performance parameter for determination. The drill bit performance parameters can be interrelated and comprise one or more of: DE, CDOC, contact area of a DOCC, WOB taken off by a DOCC, TOB taken off by a DOCC, an average of any such parameter, etc. While performance parameters may be interrelated (for example, contact area of a DOCC is negligible for any DOC less than a CDOC), ranges for parameters which correlate to mitigated CSS vibrations may be related in unexpected ways. The drill bit validator analyzes a drill bit performance parameter separate from other drill bit parameters to determine a range of values which correspond to mitigated CSS vibration. Optionally, at least one performance parameter (such as DE) is analyzed in correlation with each other drill bit performance parameter such that relationships between mitigation ranges for one or more parameters are calculated.

At block 1318, the drill bit design validator determines a range of values for the selected performance parameter that corresponds to mitigated CSS vibration. The drill bit design validator determines a range of values for CSS vibration mitigation based on the values of the PDC drill bit performance parameters, including DOCC functional characteristics, for which CSS vibrations are not detected, as compared to the values of the drill bit performance parameters for which CSS vibrations are detected. The determined range can be open ended (i.e. all values above a threshold are allowable), can be closed (i.e. only values above a lower threshold and below an upper threshold are allowable), or can correspond to an ideal value and values near such a mean or median for suppression of CSS vibrations. The determined range can be based on an absence of CSS vibration. The drill bit design validator determines, based on PDC drill bit performance parameters identified as corresponding to detected CSS vibrations, a set of values including each PDC drill bit performance parameter that are related to CSS vibration. Design rules can be exclusionary, such that any performance parameter value for which CSS vibrations are detected is removed from the multi-dimensional design parameter space (optionally including a range of values surrounding the value for which CSS vibrations are detected). Design rules can be generated based on one or more drill bit parameters. Design rules can also comprise both minimal requirements and preferred ranges for one or more drill bit performance parameters. Average, median, or mean values for drill bit performance parameters from drilling runs without detected CSS vibration or one or more midpoint of a range can be selected as preferred values for the drill bit performance parameters. In order to mitigate CSS vibrations, instances of detected CSS vibrations are controlling on performance drill bit parameter values—i.e. the presence of any detected CSS vibration for a drill bit parameter predisposes that value for exclusion.

At block 1320, the drill bit design validator determines if any further drill bit performance parameters remain to be analyzed. If one or more parameters have not been analyzed, flow continues to the drill bit parameter range determination loop at block 1314. If all drill bit performance parameters have been analyzed, flow continues to block 1324.

At block 1324, the drill bit design validator identifies a multi-dimensional design space for CSS vibration mitigation based on determined ranges for the one or more drill bit performance parameters. The drill bit design validator can identify a range, limit, or multi-dimensional space for one or more drill bit performance parameters for which there are no (or statistically few) detected CSS vibrations. The multi-dimensional design space is identified by comparing the determined values for all drill bit performance parameters. The multi-dimensional space is the set of values or range of values across all compared drill bit parameters where a drill bit with performance parameters falling within that space is expected to be free from CSS vibrations, or where previous drill bit designs having performance parameters within that space experienced no detected CSS vibrations. In some cases, mitigation ranges for one performance parameter can correspond to instances of high vibrational likelihood in another parameter—since drill bit performance parameters can be interrelated. In such cases, the multi-dimensional design space for CSS vibration mitigation omits any regions where one or more variables lies outside a range of mitigated vibration. The multi-dimensional space where vibration is mitigated is output or stored as a set of design rules or guidelines that outline values of performance parameters for which CSS vibrations are absent, not detected, or reduced. Optionally, flow continues from block 1324 to block 1325 and potential or new PDC drill bit designs are validated against the rules for mitigated vibration.

At block 1325, the drill bit design validator selects a new or potential drill bit design for validation. The drill bit performance parameters, generated in block 1302, are compared against the drill bit design rules or guidelines that identify the multi-dimensional design space for which CSS vibrations are mitigated. Each new or potential design bit is compared, as a function of its identified drill bit performance parameters, to the multi-dimensional design space.

At block 1326, the drill bit design validator compares drill bit performance parameters of a PDC drill bit design to the design rules generated at block 1324. The drill bit design validator can compare the drill bit performance parameters to one or more threshold values for the PDC drill bit, including threshold values for cone DOCC functional characteristics, as provided by the drill bit design rules or guidelines. Optionally, the drill bit design validator can compare the drill bit performance parameters to one or more preferred ranges for the PDC drill bit performance parameters. The drill bit design validator can identify drill bit designs that do not correspond to one or more minimum thresholds for CSS vibration mitigation, drill bit designs that correspond to all minimum thresholds for CSS vibration mitigation, and drill bit designs that correspond to one or more preferred ranges for CSS vibration mitigation. From block 1326, flow continues to block 1330.

At block 1330, the drill bit design validator determines, for each PDC drill bit design, if the drill bit performance parameters conform to the design rules for mitigated CSS vibration. The drill bit design validator operates on the comparison of block 1326 to determine if the new or potential drill bit design lies within the multi-dimensional design space for mitigated vibrations. The drill bit design validator can validate designs for minimum thresholds for vibration mitigation, or for preferred thresholds for vibration mitigation. The drill bit design validator can optionally identify both minimum and preferred designs. For drill bit designs that do not conform to the rules or guidelines outlining the multi-dimensional space for CSS vibration mitigation, the drill bit design validator can discard the drill bit designs or (optionally where flow continues to block 1332) adjust DOCC design such that the DOCC functional characteristics of the drill bit designs produce validated designs. For the drill bit designs that conform to the rules, flow continues to block 1333 where validated designs are grouped or stored as a set of validated drill bit designs.

At block 1333, any validated drill bit design is added to a set of validated drill bit designs. If more new or potential drill bit designs remain to be validated, flow continues to block 1325 where a new drill bit design is selected for validation. When all new or potential drill bit designs have been validated or discarded, flow continues to block 1334.

At block 1332, the drill bit design validator optionally adjusts or causes to be adjusted one or more performance parameters for a potential PDC drill bit design that does not conform to the multi-dimensional design space for CSS vibration mitigation. Such adjustment can comprise adjusting a PDC drill bit design parameter or a characteristic of cone DOCC design that directly corresponds to one or more physical dimensions of the drill bit (i.e. CDOC). The adjustment can comprise adjusting a design or performance parameter to alter the DOCC functional characteristics (such as average TOB taken off by a cone DOCC). For example, the adjustment can comprise calculating or adjusting one or more physical dimensions (i.e. back rake angle) of the drill bit. The adjustment can include a calculation or re-calculation of values for the PDC bit performance parameters, including in-cone DOCC functional characteristics, such as the calculation that occurs at block 1302, for a new or adjusted bit design. From block 1332, flow continues to block 1326, where the drill bit validator compares the modified or adjusted drill bit design to the generated rules. The drill bit design validator can adjust a non-conforming drill bit in one or more iteration, until such time as a maximum iteration count is reached or the drill bit design is validated at block 1330.

At block 1334, the drill bit design validator outputs or stores validated PDC drill bit designs for mitigated CSS vibration. The drill bit design validator can also output those of the drill bit designs which are not validated as a separate data set or file. Optionally, drill bit performance parameters such as DOC, WOB, TOB, etc. can be modified during drilling based on real time measurement of drill bit vibration. Average drill bit parameters, or averages over DOC ranges, are relatively independent of drilling conditions. However, adjustments to drilling parameters such as RPM, ROP, WOB, TOB, etc. can shift DOCC contact area, WOB taken off by a cone DOCC, TOB taken off by a cone DOCC, etc. and therefore also effect averages over a DOC range. The drill bit design validator can optionally include a module for drilling parameter control, where the drill bit design validator controls or recommends drilling adjustment such that a specific drill bit is operated within the multi-dimensional space for CSS vibration mitigation.

Figure 14:
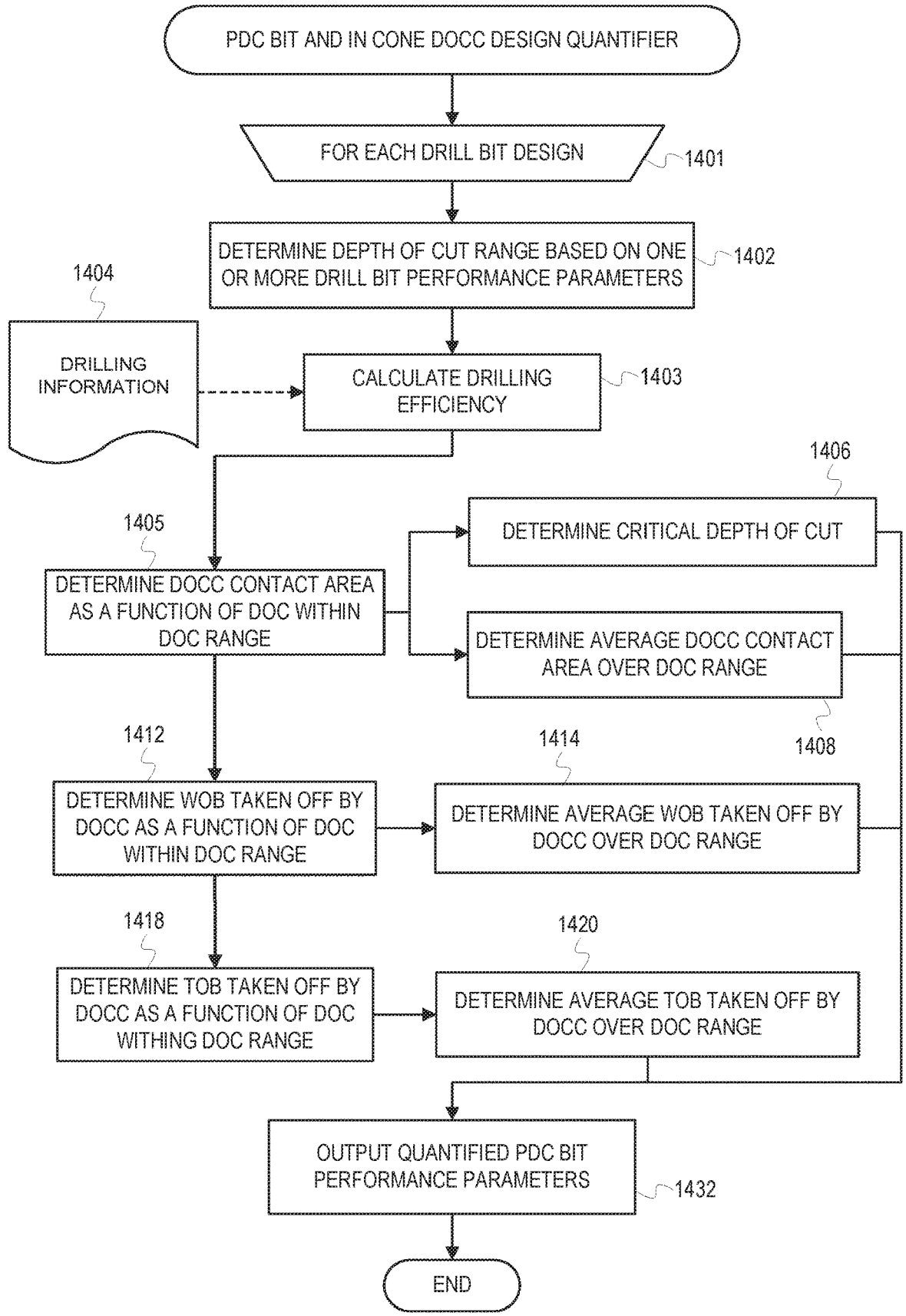
FIG. 14 is a flowchart of example operations for generating rules or guidelines to validate drill bit designs as mitigating CSS vibrations, according to some embodiments.

FIG. 14 is a flowchart of example operations for generating rules or guidelines to validate drill bit designs as mitigating CSS vibrations, according to some embodiments. A drill bit design quantifier calculates design and performance parameters, such as CDOC, average DOCC contact area, average WOB taken off by a DOCC, average TOB taken off by a DOCC, etc. for individual drill bit designs or groups of designs in order to correlate drill bit parameters to instances of CSS vibration and to instances where no CSS vibration is detected.

At block 1401, the drill bit design quantifier selects a drill bit design for quantification. If more than one drill bit design is input to the quantifier, the drill bit design quantifier operates on each drill bit design separately.

At block 1402, the drill bit design quantifier determines a depth of cut (DOC) range for a selected drill bit design. The DOC range can be calculated based on drilling data for the selected drill bit design, if the selected drill bit has been drilled or used in drilling. The DOC range can be calculated or estimated based on one or more drill bit design characteristics—design characteristics can include performance parameters or can be other drill bit design measurements, dimensions, or angles, such as number of blades, as discussed in reference to FIG. 13. The DOC range can be estimated based on drilling data from similar drill bits or can be measured from simulated drilling data. The DOC range represents the DOC the drill bit is predicted to experience within the expected course of drilling conditions. The drill bit design quantifier averages a variety of performance parameters over the DOC range in order to determine relationships between the drill bit performance parameters and instances of CSS vibration.

At block 1403, the drill bit design quantifier calculates an average drilling efficiency (DE) for the drill bit. DE can be estimated from drilling data, such as drilling data contained within a drilling information data set 1404. The drilling data can include drilling data from similar drill bits. The DE can be calculated using real world drilling data or determined based on data generated by a simulation of drilling runs. Simulated drilling data can output a drilling efficiency or average drilling efficiency that is independent of formation type. The drilling information data set 1404 can include one or more drilling parameters (RPM, ROP, WOB, TOB, etc.) for the PDC bit design, which can be used to calculate a drilling efficiency. The drill bit design quantifier correlates DE to the drill bit design and stores or outputs the DE to PDC bit parameters at block 1432.

At block 1405, the drill bit design quantifier determines a DOCC contact area as a function of DOC for an in-cone DOCC. The DOCC contact area for an in-cone DOCC changes as a function of DOC, as shown in FIG. 6. The DOCC contact area is a measurement of the surface area of interaction between the formation and any in-cone DOCCs. In-cone DOCCs have been shown to mitigate interaction between the drill bit and a borehole, including preventing CSS vibrations. From block 1405, flow continues to block 1406 (where CDOC is determined) and block 1408 (where average DOCC contact area over the DOC range is determined), and optionally to block 1412 and block 1418. The processes by which average DOCC contact area over the DOC range, average WOB taken off by a DOCC over the DOC range, and average TOB taken off by a DOCC over the DOC range are calculated are shown in parallel. Optionally, because such values are interrelated, one average can be calculated from one or more other average.

At block 1406, the drill bit design quantifier determines a critical DOC (CDOC) based on the DOCC contact area as a function of DOCC. The CDOC can be measured, estimated from drilling data, calculated from simulations of drilling, or calculated from DOCC contact area as a function of DOC. The CDOC can be calculated based on a distance from the deepest projection of the drill bit to the deepest projection of the DOCC or can be estimated from the smallest DOC where the DOCC contacts a formation face. CDOC can be calculated from a slope of the cone DOCC contact area as a function of DOC, where the cone DOCC contact area is zero for all values less than the CDOC and nonzero for all values greater than the CDOC. The drill bit design quantifier correlates the CDOC to the drill bit design and stores or outputs the CDOC to PDC bit parameters for the bit design at block 1432.

At block 1408, the drill bit design quantifier determines an average DOCC contact area over the DOC range for an in-cone DOCC. The average DOCC contact area accounts for the contact area over the range of DOC the drill is presumed to experience during drilling. The drill bit design quantifier correlates the average DOCC contact area to the drill bit design and stores or outputs the average DOCC contact area to PDC bit parameters for the bit design at block 1432.

At block 1412, the drill bit design quantifier determines a WOB taken off by an in-cone DOCC as a function of DOC. The WOB taken off by an in-cone DOCC changes as a function of DOC, as shown in FIG. 7. The WOB taken off by an in-cone DOCC is a measure of a pressure applied to a formation by the in-cone DOCC and increases as a function of depth of cut. From block 1312, flow continues to block 1414 (where average WOB taken off by an in-cone DOCC over the DOC range is calculated) and block 1418.

At block 1414, the drill bit design quantifier determines an average WOB taken off by an in-cone DOCC over the DOC range. The average WOB taken off by an in-cone DOCC accounts for the expected DOC, as shown in FIG. 7. The drill bit design quantifier correlates the average WOB taken off by an in-cone DOCC to the drill bit design and stores or outputs the average WOB taken off by an in-cone DOCC to PDC bit parameters for the drill bit at block 1432.

At block 1418, the drill bit design quantifier determines a TOB taken off by an in-cone DOCC as a function of DOC. The TOB taken off by an in-cone DOCC is a function of DOC, as shown in FIG. 8. The TOB taken off by an in-cone DOCC is a measure of the torque applied to the formation by the in-cone DOCC and increases as a function of depth of cut. From block 1418, flow continues to block 1420 (where average TOB taken off by a DOCC over the DOC range is calculated).

At block 1420, the drill bit design quantifier determines an average TOB taken off by an in-cone DOCC over the DOC range. The average TOB taken off by an in-cone DOCC accounts for the expected DOC. The drill bit design quantifier correlates the average TOB taken off by an in-cone DOCC to the drill bit design and stores or outputs the average TOB taken off by an in-cone DOCC to PDC bit parameters for the drill bit design at block 1432.

At block 1432, the drill bit design quantifier stores or outputs PDC bit parameters associated with the drill bit design. The PDC bit parameters can be output to the drill bit design validator, as discussed in reference to FIG. 13, or can be tagged or otherwise linked or identified as corresponding to each of the drill bit designs. A drill bit design, simulation of a drill bit design performance, or previously used drill bit together with its drilling data can be tagged or otherwise correlated with PDC bit design parameters for later use or validation. The DOCC functional characteristics depicted here can be calculated in any order and may comprise more parameters or a subset of the parameters identified in FIG. 14. However, values for at least one DOCC functional characteristic of an average DOCC contact area, an average WOB taken off by an in-cone DOCC, and an average TOB taken off by an in-cone DOCC is calculated. For example, the WOB taken off by the cone DOCC and the TOB taken off by the cone DOCC can be omitted, or only one value calculated. The values for the DOCC functional characteristics can be averaged over the expected DOC range or can be calculated using measured DOC from drilling data.

The example operations are described with reference to drill bit design quantifier and drill bit design validator for consistency with the earlier figure(s). The name chosen for the program code is not to be limiting on the claims. Structure and organization of a program can vary due to platform, programmer/architect preferences, programming language, etc. In addition, names of code units (programs, modules, methods, functions, etc.) can vary for the same reasons and can be arbitrary.

The flowcharts are provided to aid in understanding the illustrations and are not to be used to limit scope of the claims. The flowcharts depict example operations that can vary within the scope of the claims. Additional operations may be performed; fewer operations may be performed; the operations may be performed in parallel; and the operations may be performed in a different order. For example, the operations depicted in blocks 1412 and 1418 can be performed in parallel or concurrently. With respect to FIG. 13, a modification of a potential drill bit design is optional. It will be understood that each block of the flowchart illustrations and/or block diagrams, and combinations of blocks in the flowchart illustrations and/or block diagrams, can be implemented by program code. The program code may be provided to a processor of a general-purpose computer, special purpose computer, or other programmable machine or apparatus.

As will be appreciated, aspects of the disclosure may be embodied as a system, method or program code/instructions stored in one or more machine-readable media. Accordingly, aspects may take the form of hardware, software (including firmware, resident software, micro-code, etc.), or a combination of software and hardware aspects that may all generally be referred to herein as a "circuit," "module" or "system." The functionality presented as individual modules/units in the example illustrations can be organized differently in accordance with any one of platform (operating system and/or hardware), application ecosystem, interfaces, programmer preferences, programming language, administrator preferences, etc.

Any combination of one or more machine readable medium(s) may be utilized. The machine-readable medium may be a machine-readable signal medium or a machine-readable storage medium. A machine readable storage medium may be, for example, but not limited to, a system, apparatus, or device, that employs any one of or combination of electronic, magnetic, optical, electromagnetic, infrared, or semiconductor technology to store program code. More specific examples (a non-exhaustive list) of the machine readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a machine-readable storage medium may be any tangible medium that can contain or store a program for use by or in connection with an instruction execution system, apparatus, or device. A machine-readable storage medium is not a machine-readable signal medium.

A machine-readable signal medium may include a propagated data signal with machine readable program code embodied therein, for example, in baseband or as part of a carrier wave. Such a propagated signal may take any of a variety of forms, including, but not limited to, electromagnetic, optical, or any suitable combination thereof. A machine readable signal medium may be any machine readable medium that is not a machine readable storage medium and that can communicate, propagate, or transport a program for use by or in connection with an instruction execution system, apparatus, or device.

Program code embodied on a machine-readable medium may be transmitted using any appropriate medium, including but not limited to wireless, wireline, optical fiber cable, RF, etc., or any suitable combination of the foregoing.

The program code/instructions may also be stored in a machine readable medium that can direct a machine to function in a particular manner, such that the instructions stored in the machine readable medium produce an article of manufacture including instructions which implement the function/act specified in the flowchart and/or block diagram block or blocks.

Example Computer

Figure 15:
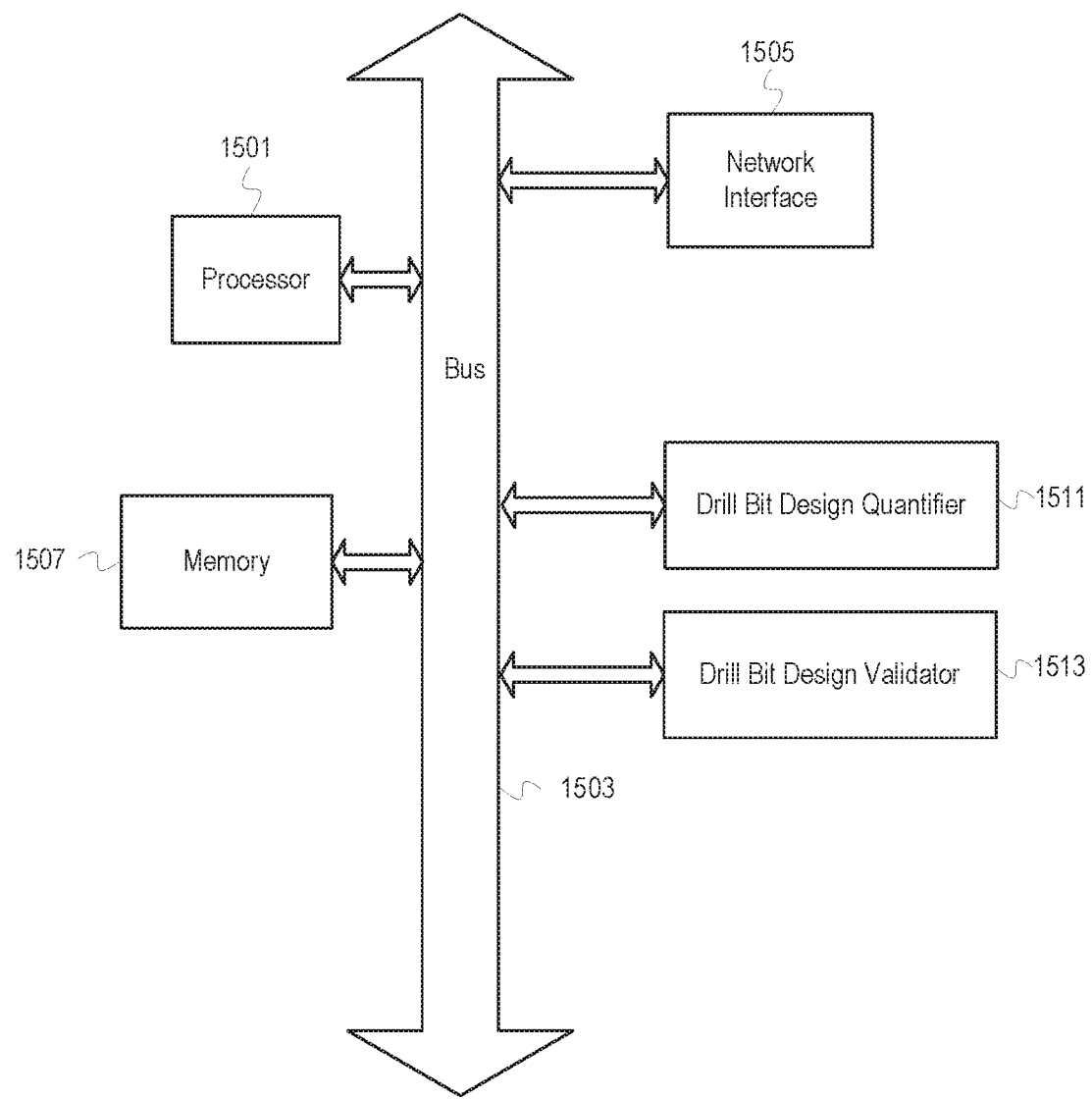
FIG. 15 depicts an example computer, according to some embodiments.

FIG. 15 depicts an example computer, according to some embodiments. The computer system can include a processor 1501 (possibly including multiple processors, multiple cores, multiple nodes, and/or implementing multi-threading, etc.). The computer system can include a memory 1507. The memory 1507 may be system memory or any one or more of the above already described possible realizations of machine-readable media. The computer system can also include a bus 1503 and a network interface 1505. The system also can include a drill bit design quantifier 1511 and a drill bit design validator 1513. The drill bit design quantifier 1511 can quantify drill bit designs by generating values of drill bit performance parameters. The drill bit design validator 1513 can generate rules for drill bit performance parameters where CSS vibrations are mitigated and can test or validates drill bit designs against such guidelines. The drill bit design quantifier 1511 can be a part of the drill bit design validator 1513. Any one of the previously described functionalities may be partially (or entirely) implemented in hardware and/or on the processor 1501. For example, the functionality may be implemented with an application specific integrated circuit, in a logic implemented in the processor 1501, in a co-processor on a peripheral device or card, etc. Further, realizations may include fewer or additional components not illustrated in FIG. 15 (e.g., video cards, audio cards, additional network interfaces, peripheral devices, etc.). The processor 1501 and the network interface 1505 can be coupled to the bus 1503. Although illustrated as being coupled to the bus 1503, the memory 1507 may be coupled to the processor 1501.

While the aspects of the disclosure are described with reference to various implementations and exploitations, it will be understood that these aspects are illustrative and that the scope of the claims is not limited to them. In general, techniques for drill bit design quantification and validation as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the disclosure. In general, structures and functionality presented as separate components in the example configurations may be implemented as a combined structure or component. Similarly, structures and functionality presented as a single component may be implemented as separate components. These and other variations, modifications, additions, and improvements may fall within the scope of the disclosure.

EXAMPLE EMBODIMENTS

Embodiment 1: A method comprising determining at least one value for one or more drill bit performance parameters for a design of a drill bit, wherein the one or more drill bit performance parameters comprises a functional characteristic of a depth of cut controller of the drill bit, correlating one or more instances of cutting-induced stick-slip vibration for at least one prior drilling operation to the at least one value for the one or more drill bit performance parameters, and generating drill bit design rules that mitigate cutting-induced stick-slip vibration based on the correlating.

Embodiment 2: The method of Embodiment 1, wherein the one or more drill bit performance parameters comprises at least one of a critical depth of cut, a weight on the drill bit taken off by the depth of cut controller of the drill bit, a contact area of the depth of cut controller, and a torque on the drill bit taken off by the depth of cut controller.

Embodiment 3: The method of Embodiments 1 or 2, wherein the one or more instances of cutting-induced stick-slip vibration comprises vibrations detected along an axial axis and along a torsional axis from drilling data for the at least one prior drilling operation.

Embodiment 4: The method of any one of Embodiments 1-3, wherein the at least one prior drilling operation comprises an actual drilling operation.

Embodiment 5: The method of any one of Embodiments 1-4, wherein correlating comprises performing the following operations for each of the at least one prior drilling operation: determining whether vibrational data from the at least one prior drilling operation includes an instance of the one or more instances of the cutting-induced stick-slip vibration, and in response to determining that the vibrational data from the at least one prior drilling operation includes the instance of the one or more instances of the cutting-induced stick-slip vibration, marking the at least one prior drilling operation as having cutting-induced stick-slip vibration.

Embodiment 6: The method of any one of Embodiments 1-5, wherein generating drill bit design rules that mitigate cutting-induced stick-slip vibration comprises generating drill bit design rules that define a threshold value for the functional characteristic of the depth of cut controller in a cone of the drill bit.

Embodiment 7: The method of Embodiment 6, further comprising validating the drill bit design based on the drill bit design rules, wherein validating comprises determining that a value for the functional characteristic of the depth of cut controller of the at least one value for the one or more drill bit performance parameters satisfies the defined threshold value.

Embodiment 8: The method of Embodiments 6 or 7, further comprising determining that a value for the functional characteristic of the depth of cut controller of the at least one value for the one or more drill bit performance parameters does not satisfy the defined threshold value, and adjusting the value for the functional characteristic of the depth of cut controller to satisfy the defined threshold value Embodiment 9: The method any one of Embodiments 1-8, wherein the functional characteristic of the depth of cut controller comprises at least one of an average contact area of the depth of cut controller, an average weight on the drill bit taken off by the depth of cut controller, and an average torque on the drill bit taken off by the depth of cut controller.

Embodiment 10: The method of any one of Embodiments 1-9, wherein the one or more drill bit performance parameters comprises a drilling efficiency, and wherein generating drill bit design rules that mitigate cutting-induced stick-slip vibration comprises determining a threshold value for the drilling efficiency.

Embodiment 11: A non-transitory, computer-readable medium having instructions stored thereon that are executable by a computing device to perform operations comprising: determine at least one value for one or more drill bit performance parameters for a design of a drill bit, wherein the one or more drill bit performance parameters comprises a functional characteristic of a depth of cut controller of the drill bit, correlate one or more instances of cutting-induced stick-slip vibration for at least one prior drilling operation to the at least one value for the one or more drill bit performance parameters, and generate drill bit design rules that mitigate cutting-induced stick-slip vibration based on the correlation.

Embodiment 12: The non-transitory, computer-readable media of Embodiment 11, wherein the one or more drill bit performance parameters comprises at least one of a critical depth of cut, a weight on the drill bit taken off by the depth of cut controller of the drill bit, a contact area of the depth of cut controller, and a torque on the drill bit taken off by the depth of cut controller.

Embodiment 13: The non-transitory, computer-readable media of Embodiments 11 or 12, wherein the operations to generate drill bit design rules that mitigate cutting-induced stick-slip vibration comprise operations to define a threshold value for the functional characteristic of the depth of cut controller in a cone of the drill bit.

Embodiment 14: The non-transitory, computer-readable media of Embodiment 13, wherein the operations comprise operations to validate the drill bit design based on the generated drill bit design rules, wherein the operations to validate the drill bit design comprise operations to determine that a value for the functional characteristic of the depth of cut controller of the at least one value for the one or more drill bit performance parameters satisfies the defined threshold value.

Embodiment 15: The non-transitory, computer-readable media of Embodiments 13 or 14, wherein the operations comprise operations to determine that a value for the functional characteristic of the depth of cut controller of the at least one value for the one or more drill bit performance parameters does not satisfy the defined threshold value, and adjust the value for the functional characteristic of the depth of cut controller to satisfy the defined threshold value.

Embodiment 16: An apparatus comprising a processor and a computer-readable medium having instructions stored thereon that are executable by the processor to cause the apparatus to determine at least one value for one or more drill bit performance parameters for a design of a drill bit, wherein the one or more drill bit performance parameters comprises a functional characteristic of a depth of cut controller of the drill bit, correlate one or more instances of cutting-induced stick-slip vibration for at least one prior drilling operation to the at least one value for the one or more drill bit performance parameters, and generate drill bit design rules that mitigate cutting-induced stick-slip vibration based on the correlation.

Embodiment 17: The apparatus of Embodiment 16, wherein the one or more drill bit performance parameters comprises at least one of a critical depth of cut, a weight on the drill bit taken off by the depth of cut controller of the drill bit, a contact area of the depth of cut controller, and a torque on the drill bit taken off by the depth of cut controller.

Embodiment 18: The apparatus of Embodiments 16 or 17, wherein the instructions executable by the processor cause the apparatus to generate drill bit design rules that mitigate cutting-induced stick-slip vibration comprise instructions executable by the processor to cause the apparatus to define a threshold value for the functional characteristic of the depth of cut controller in a cone of the drill bit.

Embodiment 19: The apparatus of Embodiment 18, wherein the instructions further comprise instructions executable by the processor to cause the apparatus to validate the drill bit design based on the drill bit design rules, wherein the instructions executable by the processor to cause the apparatus to validate the drill bit design comprise instructions executable by the processor to cause the apparatus to determine that a value for the functional characteristic of the depth of cut controller of the at least one value for the one or more drill bit performance parameters satisfies the defined threshold value.

Embodiment 20: The apparatus of Embodiments 18 or 19, wherein the instructions further comprise instructions executable by the processor to cause the apparatus to determine that a value for the functional characteristic of the depth of cut controller of the at least one value for the one or more drill bit performance parameters does not satisfy the defined threshold value, and adjust the value for the functional characteristic of the depth of cut controller to satisfy the defined threshold value.

As used herein, the term "or" is inclusive unless otherwise explicitly noted. Thus, the phrase "at least one of A, B, or C" is satisfied by any element from the set {A, B, C} or any combination thereof, including multiples of any element.

The invention claimed is:

1. A method comprising:
    determining at least one value for one or more drill bit performance parameters for a design of a drill bit, wherein the one or more drill bit performance parameters comprises a functional characteristic of a depth of cut controller in a cone of the drill bit;
    correlating one or more instances of cutting-induced stick-slip vibration for at least one prior drilling operation to the at least one value for the one or more drill bit performance parameters;
    generating drill bit design rules that mitigate cutting-induced stick-slip vibration based on the correlating, wherein generating drill bit design rules includes defining a threshold value for the functional characteristic of the depth of cut controller;
    adjusting the value for the functional characteristic of the depth of cut controller to satisfy the defined threshold value;
    updating the drill bit design rules based on the adjusted value for the functional characteristic of the depth of cut controller; and
    communicating with drilling tools positioned downhole to adjust drilling parameters in real time according to the updated drill bit design rules.

2. The method of claim 1, wherein the one or more drill bit performance parameters comprises at least one of a critical depth of cut, a weight on the drill bit taken off by the depth of cut controller of the drill bit, a contact area of the depth of cut controller, and a torque on the drill bit taken off by the depth of cut controller.

3. The method of claim 1, wherein the one or more instances of cutting-induced stick-slip vibration comprises vibrations detected along an axial axis and along a torsional axis from drilling data for the at least one prior drilling operation.

4. The method of claim 1, wherein the at least one prior drilling operation comprises an actual drilling operation.

5. The method of claim 1, wherein correlating comprises performing the following operations for each of the at least one prior drilling operation:
    determining that vibrational data from the at least one prior drilling operation includes an instance of the one or more instances of cutting-induced stick-slip vibration; and
    marking the at least one prior drilling operation as having cutting-induced stick-slip vibration.

6. The method of claim 1, further comprising:
    validating the drill bit design based on the drill bit design rules, wherein validating comprises determining that a value for the functional characteristic of the depth of cut controller of the at least one value for the one or more drill bit performance parameters satisfies the defined threshold value.

7. The method of claim 1, wherein the functional characteristic of the depth of cut controller comprises at least one of an average contact area of the depth of cut controller, an average weight on the drill bit taken off by the depth of cut controller, and an average torque on the drill bit taken off by the depth of cut controller.

8. The method of claim 1,
    wherein the one or more drill bit performance parameters comprises a drilling efficiency, and
    wherein generating drill bit design rules that mitigate cutting-induced stick-slip vibration comprises determining a threshold value for the drilling efficiency.

9. The method of claim 1, wherein the generated drill bit design rules include a minimum bit drilling efficiency and at least one value relating to the functional characteristic of the depth of cut controller.

10. A non-transitory, computer-readable medium having instructions stored thereon that are executable by a computing device, the instructions comprising:
    instructions to determine at least one value for one or more drill bit performance parameters for a design of a drill bit, wherein the one or more drill bit performance parameters comprises a functional characteristic of a depth of cut controller in the cone of the drill bit;
    instructions to correlate one or more instances of cutting-induced stick-slip vibration for at least one prior drilling operation to the at least one value for the one or more drill bit performance parameters;
    instructions to generate drill bit design rules that mitigate cutting-induced stick-slip vibration based on the correlation, wherein the instructions to generate drill bit design rules include defining a threshold value for the functional characteristic of the depth of cut controller;
    instructions to adjust the value for the functional characteristic of the depth of cut controller to satisfy the defined threshold value;
    instructions to update the drill bit design rules based on the adjusted value for the functional characteristic of the depth of cut controller; and
    instructions to communicate with drilling tools positioned downhole to adjust drilling parameters in real time according to the updated drill bit design rules.

11. The non-transitory, computer-readable medium of claim 10, wherein the one or more drill bit performance parameters comprises at least one of a critical depth of cut, a weight on the drill bit taken off by the depth of cut controller of the drill bit, a contact area of the depth of cut controller, and a torque on the drill bit taken off by the depth of cut controller.

12. The non-transitory, computer-readable medium of claim 10, further comprising instructions to validate the drill bit design based on the drill bit design rules; and
    wherein the instructions to validate the drill bit design comprise instructions to instructions to determine that a value for the functional characteristic of the depth of cut controller of the at least one value for the one or more drill bit performance parameters satisfies the defined threshold value.

13. An apparatus comprising:
    a processor; and
    a computer-readable medium having instructions stored thereon that are executable by the processor to cause the apparatus to:
        determine at least one value for one or more drill bit performance parameters for a design of a drill bit, wherein the one or more drill bit performance parameters comprises a functional characteristic of a depth of cut controller in the cone of the drill bit;
        correlate one or more instances of cutting-induced stick-slip vibration for at least one prior drilling operation to the at least one value for the one or more drill bit performance parameters;
        generate drill bit design rules that mitigate cutting-induced stick-slip vibration based on the correlation, wherein generating drill bit design rules includes defining a threshold value for the functional characteristic of the depth of cut controller;
        adjusting the value for the functional characteristic of the depth of cut controller to satisfy the defined threshold value;
        updating the drill bit design rules based on the adjusted value for the functional characteristic of the depth of cut controller; and
        communicate with drilling tools positioned downhole to adjust drilling parameters in real time according to the drill bit design rules.

14. The apparatus of claim 13, wherein the one or more drill bit performance parameters comprises at least one of a critical depth of cut, a weight on the drill bit taken off by the depth of cut controller of the drill bit, a contact area of the depth of cut controller, and a torque on the drill bit taken off by the depth of cut controller.

15. The apparatus of claim 13, wherein the instructions further comprise instructions executable by the processor to cause the apparatus to:
    validate the drill bit design based on the drill bit design rules, wherein the instructions executable by the processor to cause the apparatus to validate the drill bit design comprise instructions executable by the processor to cause the apparatus to:
        determine that a value for the functional characteristic of the depth of cut controller of the at least one value for the one or more drill bit performance parameters satisfies the defined threshold value.

16. The apparatus of claim 13, wherein the generated drill bit design rules include a minimum bit drilling efficiency and at least one value relating to the functional characteristic of the depth of cut controller.

17. The apparatus of claim 13, wherein the one or more instances of cutting-induced stick-slip vibration comprises vibrations detected along an axial axis and along a torsional axis from drilling data for the at least one prior drilling operation.

18. The apparatus of claim 13, wherein the at least one prior drilling operation comprises an actual drilling operation.

19. The apparatus of claim 13, wherein correlating comprises performing the following operations for each of the at least one prior drilling operation:
    determining that vibrational data from the at least one prior drilling operation includes an instance of the one or more instances of cutting-induced stick-slip vibration; and
    marking the at least one prior drilling operation as having cutting-induced stick-slip vibration.

* * * * *